US012761565B2

(12) United States Patent
Chen et al.

(10) Patent No.: US 12,761,565 B2
(45) Date of Patent: Oct. 13, 2026

(54) LITHOGRAPHIC SYSTEM, AND METHOD OF USING THE SAME TO PERFORM LITHOGRAPHY

(71) Applicant: TAIWAN SEMICONDUCTOR MANUFACTURING COMPANY, LTD., Hsinchu (TW)

(72) Inventors: Chun Lin Chen, Hsinchu (TW); De-Fang Huang, Hsinchu (TW); Chen-Chang Wu, Hsinchu (TW); Chung-Nan Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 101 days.

(21) Appl. No.: 18/806,079

(22) Filed: Aug. 15, 2024

(65) Prior Publication Data

US 2026/0050221 A1 Feb. 19, 2026

(51) Int. Cl.
*G03F 7/00* (2006.01)

(52) U.S. Cl.
CPC ........ *G03F 7/70075* (2013.01); *G03F 7/0035* (2013.01); *G03F 7/70141* (2013.01); *G03F 7/7015* (2013.01)

(58) Field of Classification Search
CPC ............... G03F 7/70075; G03F 7/0035; G03F 7/70141; G03F 7/7015
See application file for complete search history.

(56) References Cited

U.S. PATENT DOCUMENTS

| | | | | | |
|---|---|---|---|---|---|
| 5,994,006 | A * | 11/1999 | Nishi | G03F 7/70558 430/30 |
| 7,061,583 | B2 * | 6/2006 | Mulkens | G03F 7/701 355/53 |
| 8,823,921 | B2 * | 9/2014 | Zlatanov | G03F 7/70066 355/71 |
| 2009/0086176 | A1 * | 4/2009 | Meisburger | G03F 7/70291 355/50 |
| 2012/0013877 | A1 * | 1/2012 | Tanaka | G02B 27/0961 355/77 |

* cited by examiner

*Primary Examiner* — Hung V Nguyen
(74) *Attorney, Agent, or Firm* — Birch, Stewart, Kolasch & Birch, LLP

(57) ABSTRACT

A method of using a lithographic system to perform lithography is provided. The lithographic system includes an illuminator and a projection apparatus. The illuminator is configured to output a light beam from a light source unit to a reticle through a beam shaping unit, a diffuser unit, a light pipe unit and an exposure control unit to generate a patterned light beam. The projection apparatus is configured to project the patterned light beam onto a wafer coated with a photoresist layer. The aperture of the diffuser unit is changed based on a dataset that is related a lithographic process and that includes a thickness of the photoresist layer and a numerical aperture value of a numerical aperture component of the projection apparatus. Then, the lithographic system performs the lithographic process on the wafer with the diffuser unit having the aperture thus changed.

20 Claims, 27 Drawing Sheets

LITHOGRAPHIC SYSTEM, AND METHOD OF USING THE SAME TO PERFORM LITHOGRAPHY

BACKGROUND

In semiconductor manufacturing, lithography is a process to transfer intricate circuit patterns onto a silicon wafer, which forms the foundation for creating integrated circuits (ICs). This process is fundamental to production of microchips that are used in various electronic devices. Precise control of light during lithography is a key to achieve good circuit performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
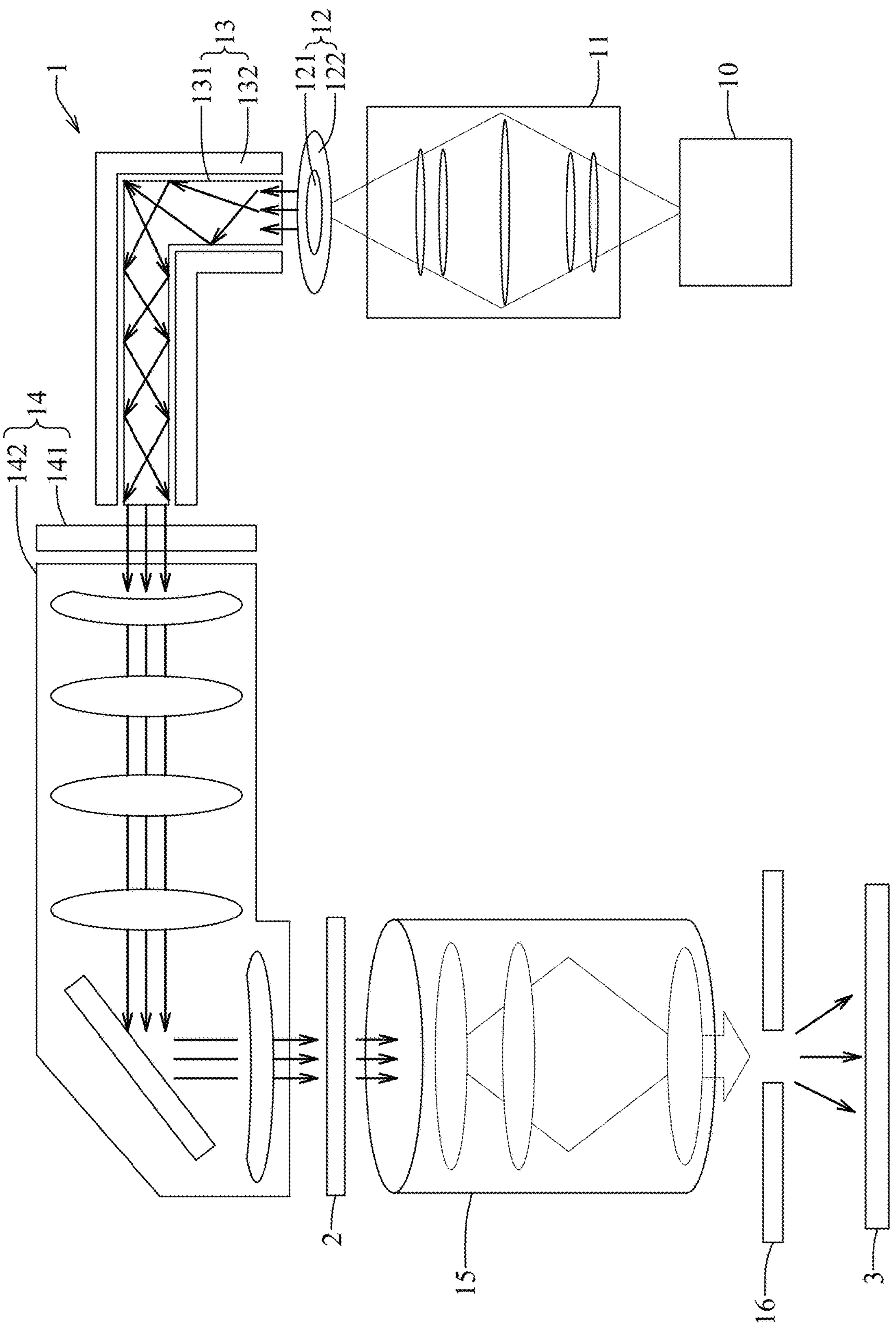
FIG. 1 is a schematic diagram illustrating an embodiment of a lithographic system according to this disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

FIG. 1 illustrates a lithographic system 1 in accordance with some embodiments. The lithographic system 1 includes an illuminator configured to emit light to a reticle (also called a photomask) 2, and a projection apparatus configured to project light patterned by the reticle 2 onto a wafer 3 that is coated with a photoresist layer, thereby forming a desired pattern on the photoresist layer. In the illustrative embodiment, the illuminator includes a light source unit 10, a beam shaping unit 11, a diffuser unit 12, a light pipe unit 13, and an exposure control unit 14, and is configured to output a light beam from the light source unit 10 to the reticle 2 through the beam shaping unit 11, the diffuser unit 12, the light pipe unit 13 and the exposure control unit 14. After an initial light beam emitted from the light source unit 10 propagates through the beam shaping unit 11, the diffuser unit 12, the light pipe unit 13, the exposure control unit 14 and the reticle 2, a patterned light beam is generated. In the illustrative embodiment, the projection apparatus includes a projection lens assembly 15 and a numerical aperture (NA) component 16, and is configured to receive and project the patterned light beam onto the wafer 3.

The light source unit 10 may be configured to generate and emit the initial light beam that is in the ultraviolet (UV) spectrum, the deep ultraviolet (DUV) spectrum, the extreme ultraviolet (EUV) spectrum, or any other suitable spectrum. In accordance with some embodiments, the light source unit 10 may include a lamp (e.g., a mercury lamp) to emit light, and a reflector (such as an ellipsoidal mirror, not shown) that surrounds the lamp to collect and direct the emitted light toward the next optical component, such as the beam shaping unit 11. In accordance with some embodiments, the light source unit 10 may include a laser system. However, this disclosure is not limited to any specific implementation of the light source unit 10.

The beam shaping unit 11 is configured to receive the initial light beam from the light source unit 10, and is configured to modify a spatial profile of the initial light beam to achieve a desired beam shape, thereby outputting a first modified light beam. In accordance with some embodiments, the beam shaping unit 11 includes an axicon unit that is capable of creating a specific beam shape, such as an annular beam or a Bessel beam. However, this disclosure is not limited to any specific implementation of the beam shaping unit 11.

The diffuser unit 12 is mounted to an inlet end of the light pipe unit 13, is disposed to receive the first modified light beam from the beam shaping unit 11, and is configured to reduce stray light and interference in the first modified light beam, and to allow passage of main components of the first modified light beam with minimal reflection, thereby outputting a second modified light beam to the light pipe unit 13. The diffuser unit 12 includes a diffuser lens 121 and an opaque mask component 122, where the diffuser lens 121 is exposed through an aperture of the mask component 122.

The light pipe unit 13, also called a beam homogenizer, includes a light pipe 131, and a pipe housing 132 that accommodates the light pipe 131, and is disposed to receive the second modified light beam from the diffuser unit 12. In accordance with some embodiments, the light pipe 131 includes a crystal rod, such as a quartz rod, which is configured to make the second modified light beam undergo multiple total internal reflections off an inner surface of the light pipe 131. This homogenizes the light by mixing rays that may have different intensities and spatial profiles to result in a more uniform intensity distribution, and ensures that the light remains confined within the light pipe 131, thereby allowing efficient transmission and uniform intensity of the light beam. As a result, the light pipe unit 13 outputs a third modified light beam with a uniform intensity.

The exposure control unit 14 is disposed to receive the third modified light beam from the light pipe unit 13, and is configured to control light provided to the reticle 2. In the illustrative embodiment, the exposure control unit 14 includes a reticle masking (REMA) blade assembly 141 and a REMA lens assembly 142. The REMA blade assembly 141 is configured to dynamically modify the third modified light beam into a slit light beam, and the REMA lens assembly 142 includes a plurality of lenses configured to optimize the slit light beam in terms of uniformity, thereby outputting a fourth modified light beam to the reticle 2.

The reticle 2 is placed on a reticle stage (not shown) of the lithographic system 1 to receive the fourth modified light beam, and modifies the fourth modified light beam into a patterned light beam.

The projection lens assembly 15 is disposed to receive and modify the patterned light beam to output a fifth modified light beam. In accordance with some embodiments, the projection lens assembly 15 may include a plurality of projection lenses, and a motor (not shown) configured to move the projection lenses, so as to adjust field curvature.

The numerical aperture component 16 is configured to have an adjustable numerical aperture, and is operable to permit passage of the fifth modified light beam to be projected onto the wafer 3.

Figure 2:
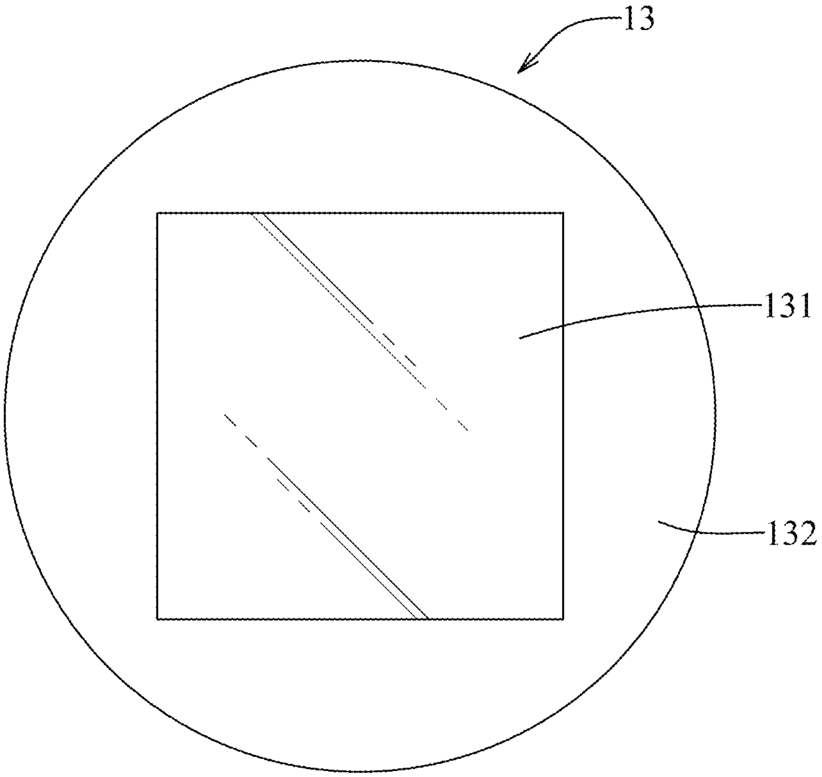
FIG. 2 is a front view of an inlet end of a light pipe unit of the lithographic system of the embodiment.

FIG. 2 exemplarily illustrates a front view of an inlet end of the light pipe unit 13. In some embodiments, the pipe housing 132 has a square aperture that defines an aperture of the inlet end of the light pipe unit 13 and that exposes the light pipe 131 accommodated in the pipe housing 132. In some other embodiments, the aperture of the pipe housing 132 may be in other shapes, such as a circle, and this disclosure is not limited in this respect.

Figure 3:
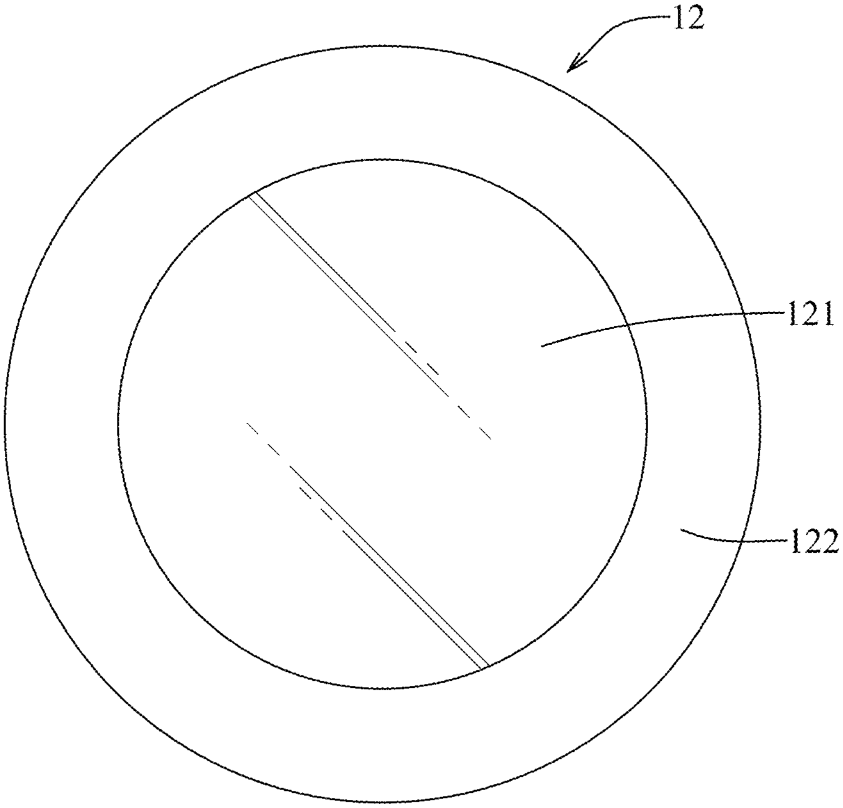
FIG. 3 is a front view of a first embodiment of a diffuser unit of the lithographic system according to this disclosure.

FIG. 3 exemplarily illustrates a front view of the diffuser unit 12 in accordance with a first embodiment. The mask component 122 has an aperture that defines an aperture of the diffuser unit 12, and the diffuser lens 121 is exposed through the aperture of the mask component 122. In the illustrative embodiment, the aperture of the mask component 122 is circular, and the mask component 122 is formed in one piece, but this disclosure is not limited in these respects.

Figure 4:
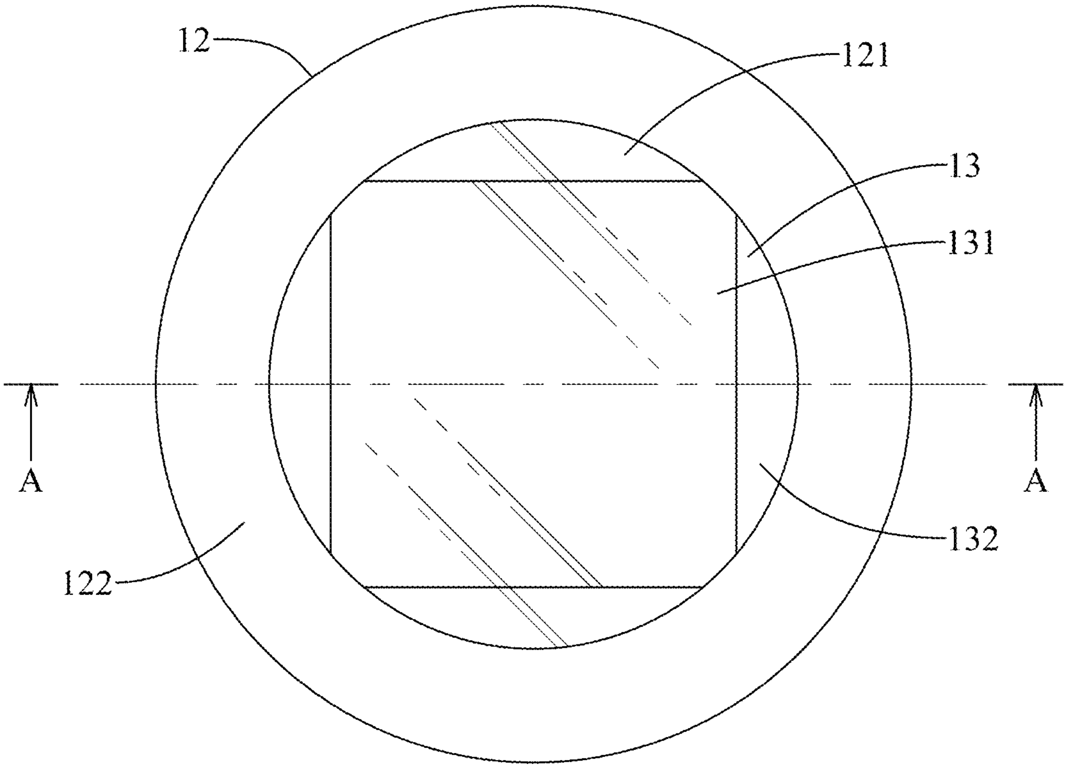
FIG. 4 is a front view of an assembly of the light pipe unit and the first embodiment of the diffuser unit according to this disclosure.

FIG. 4 exemplarily illustrates a front view of an assembly of the diffuser unit 12 as shown in FIG. 3 and the light pipe unit 13 as shown in FIG. 2. The diffuser unit 12 is mounted to the inlet end of the light pipe unit 13, and the aperture of the diffuser unit 12 is aligned with the aperture of the light pipe unit 13. In the illustrative embodiment, a diameter of the aperture of the diffuser unit 12 is greater than a side length of the aperture of the inlet end of the light pipe unit 13, so the pipe housing 132 can be partially seen through the diffuser lens 121, but this disclosure is not limited in this respect.

Figure 5:
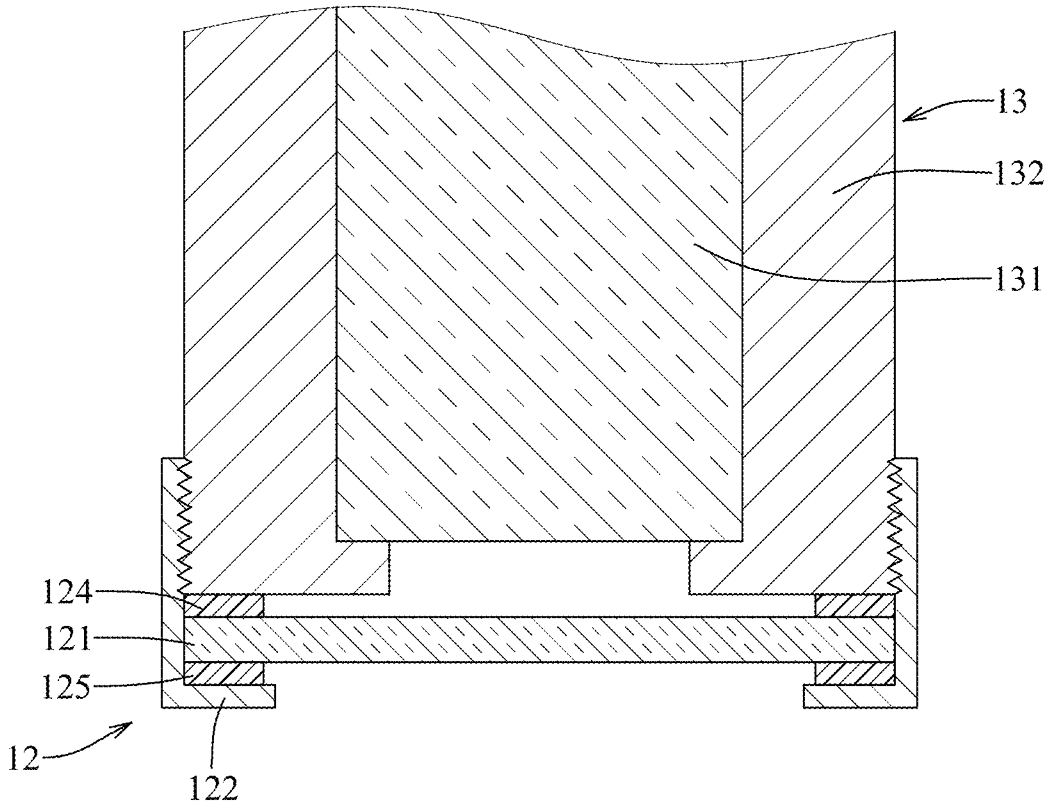
FIGS. 5 through 9 are sectional views each illustrating the assembly of the light pipe unit and a respective implementation of the diffuser unit in the first embodiment, taken along line A-A in FIG. 4.

FIG. 5 is a sectional view taken along line A-A in FIG. 4, illustrating a first implementation of the assembly of the diffuser unit 12 and the light pipe unit 13 in accordance with the first embodiment. The pipe housing 132 includes a wall portion that extends along a longitudinal direction of the light pipe 131, and a limiting portion that extends inward from an end of the wall portion. The limiting portion of the pipe housing 132 forms the aperture of the light pipe unit 13 to expose the light pipe 131, and cooperates with the wall portion to confine the light pipe 131 within the pipe housing 132. The mask component 122 has a mounting portion that extends along a longitudinal direction of the light pipe unit 13, and a mask portion that extends inward from an end of the mounting portion to define the aperture of the diffuser unit 12. In the illustrative embodiment, the aperture of the diffuser unit 12 is greater than the aperture of the light pipe unit 13, but this disclosure is not limited in this respect. The mounting portion of the mask component 122 is sleeved on and engaged with the pipe housing 132, for example. In the illustrative embodiment, the mounting portion of the mask component 122 has an inner surface formed with threads, the wall portion of the pipe housing 132 has an outer surface formed with threads, and the mounting portion of the mask component 122 and the wall portion of the pipe housing 132 are threadedly engaged together. In accordance with some embodiments, the mask component 122 and the pipe housing 132 may be engaged together using other suitable mechanisms, such as a latch mechanism, and this disclosure is not limited to any specific engagement between the diffuser unit 12 and the light pipe unit 13. For example, the diffuser lens 121 is greater than the aperture of the mask component 122 in size, and is disposed between the mask portion of the mask component 122 and the light pipe unit 13, with an outer portion being covered by the mask portion of the mask component 122. In the illustrative embodiment, the diffuser unit 12 further includes a first cushioning member 124 sandwiched between the diffuser lens 121 and the pipe housing 132, and a second cushioning member 125 sandwiched between the diffuser lens 121 and the mask portion of the mask component 122. In accordance with some embodiments, the cushioning members 124, 125 may be made of an elastic material such as rubber, a metal material that is softer than the diffuser lens 121, or other suitable materials, so as to secure the diffuser lens 121 between the mask component 122 and the pipe housing 132, and prevent the diffuser lens 121 from being scratched or damaged by the mask component 122 and the pipe housing 132. For example, the widths of the cushioning members 124, 125 are not greater than the width of the mask portion of the mask component 122, and thus do not affect the aperture of the diffuser unit 12. However, this disclosure is not limited to the use of the cushioning members 124, 125. In some embodiments, the cushioning members 124, 125 may be omitted.

Figure 6:
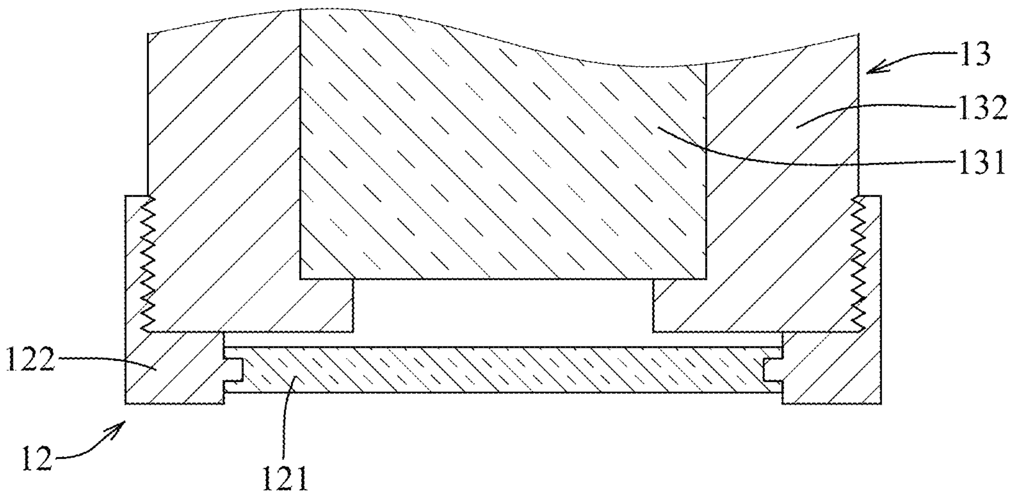

FIG. 6 is a sectional view taken along line A-A in FIG. 4, illustrating a second implementation of the assembly of the diffuser unit 12 and the light pipe unit 13 in accordance with the first embodiment. The second implementation is similar to the first implementation, and differs in that the size of the diffuser lens 121 in the second implementation is the same as the size of the aperture of the diffuser unit 12, that the diffuser lens 121 in the second implementation has an annular groove formed in a peripheral surface thereof, and that the mask portion of the mask component 122 in the second implementation has an annular protrusion fitting the groove of the diffuser lens 121 and extending into the groove of the diffuser lens 121, thereby securing the diffuser lens 121 in position. In this implementation, the masking portion of the mask component 122 does not extend in front of the diffuser lens 121, so there is no risk for a front surface of the diffuser lens 121 to contact the mask component 122, and the second cushioning member 125 can be omitted. Furthermore, the mask portion of the mask component 122 is thicker than the diffuser lens 121, and the diffuser lens 121 is mounted to the mask component 122 in such a way that the front and rear surfaces of the diffuser lens 121 are respectively receded from the front and rear surfaces of the mask portion of the mask component 122, thereby preventing the rear surface of the diffuser lens 121 from contacting the pipe housing 132, and the first cushioning member 124 as used in the first implementation (see FIG. 5) can be omitted. The omission of the cushioning members 124 and 125 may save material cost.

Figure 7:
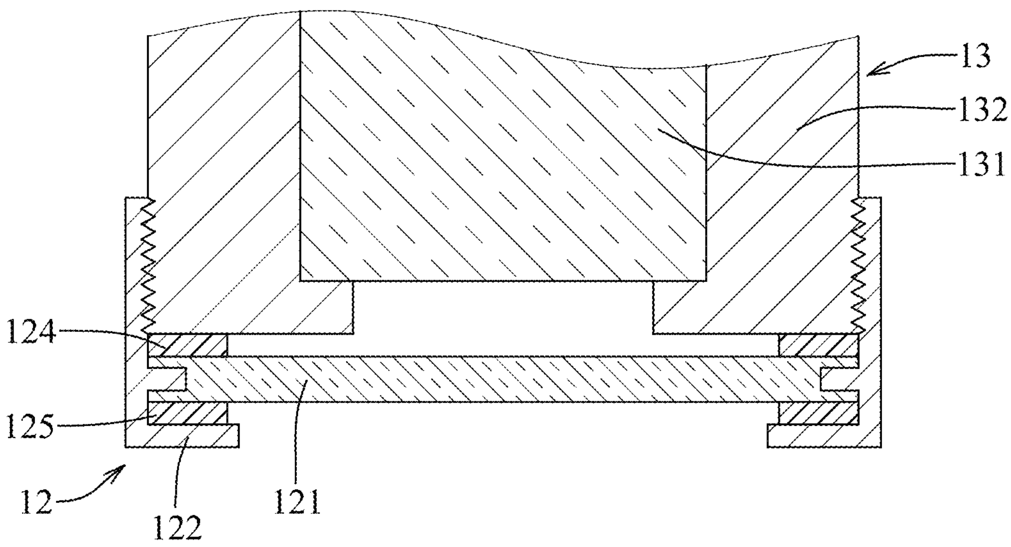

FIG. 7 is a sectional view taken along line A-A in FIG. 4, illustrating a third implementation of the assembly of the diffuser unit 12 and the light pipe unit 13 in accordance with the first embodiment. The third implementation is similar to the first implementation, and differs in that, in the third implementation, the diffuser lens 121 has an annular groove formed in a peripheral surface thereof, and the mounting portion of the mask component 122 has an annular protrusion laterally extending into the groove of the diffuser lens 121, thereby securing the diffuser lens 121 more firmly in position.

Figure 8:
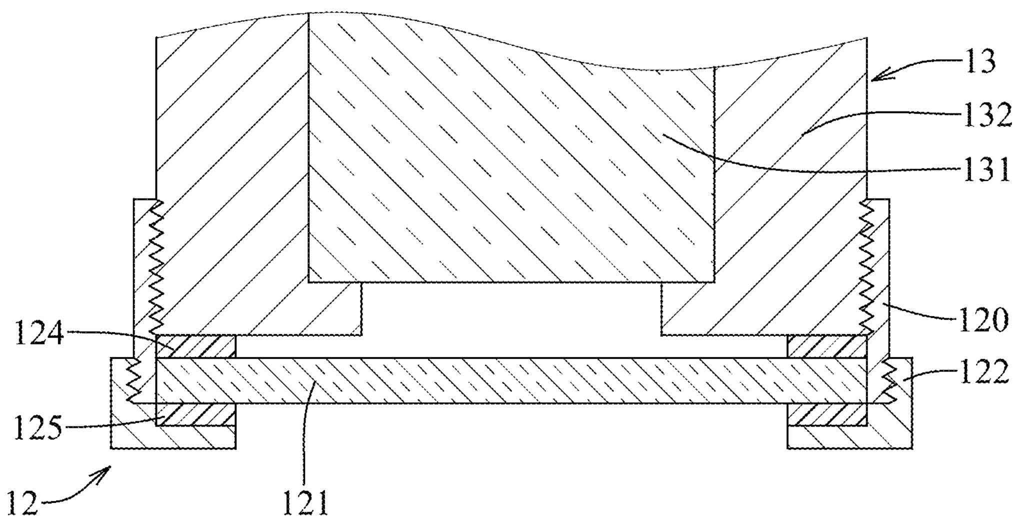

FIG. 8 is a sectional view taken along line A-A in FIG. 4, illustrating a fourth implementation of the assembly of the diffuser unit 12 and the light pipe unit 13 in accordance with the first embodiment. The fourth implementation is similar to the first implementation, and differs in that, in the fourth implementation, the diffuser unit 12 further includes a connecting tube 120 engaged with the inlet end of the light pipe unit 13, and the mask component 122 is engaged with the connecting tube 120. In other words, the mask component 122 is mounted to the light pipe unit 13 through the connecting tube 120. In the illustrative embodiment, the connecting tube 120 has a first end portion formed with threads in an inner surface thereof, and a second end portion formed with threads in an outer surface thereof. The first end portion of the connecting tube 120 is threadedly engaged with the pipe housing 132, and the second end portion, which is opposite to the first end portion, is threadedly engaged with the mask component 122. In accordance with some embodiments, the connection between the connecting tube 120 and the pipe housing 132 and the connection between the connecting tube 120 and the mask component 122 may employ any other suitable connecting mechanisms, such as latch mechanisms, and this disclosure is not limited in this respect.

Figure 9:
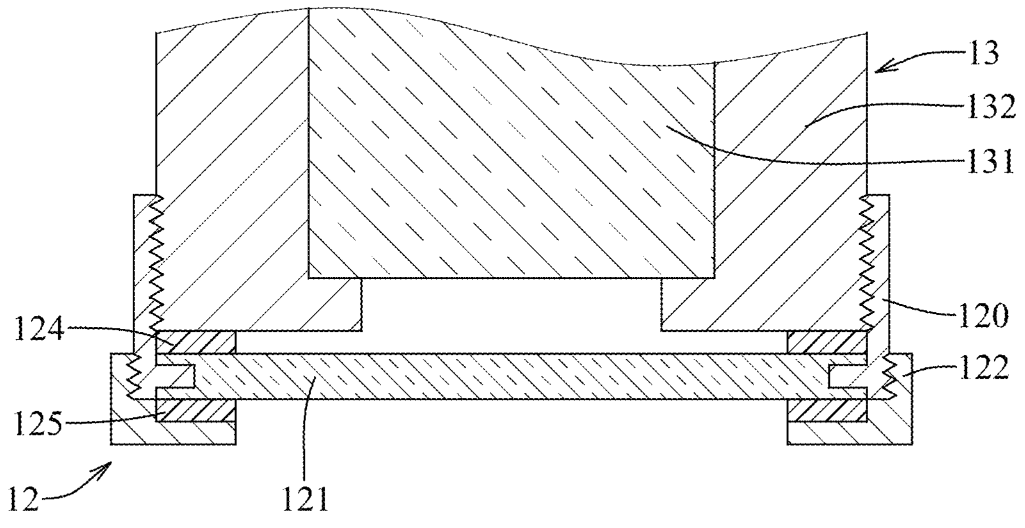

FIG. 9 is a sectional view taken along line A-A in FIG. 4, illustrating a fifth implementation of the assembly of the diffuser unit 12 and the light pipe unit 13 in accordance with the first embodiment. The fifth implementation is similar to the fourth implementation, and differs in that, in the fifth implementation, the diffuser lens 121 has an annular groove formed in a peripheral surface thereof, and the connecting tube 120 has an annular protrusion laterally extending into the groove of the diffuser lens 121, thereby securing the diffuser lens 121 more firmly in position.

Figure 10:
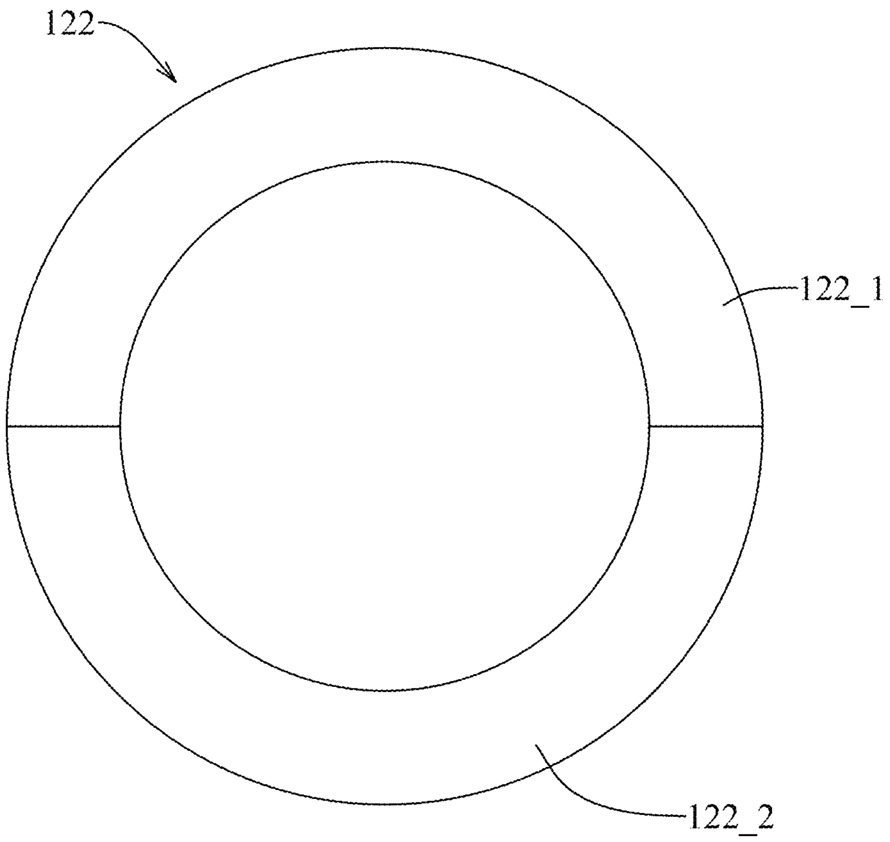
FIGS. 10 through 13 are front views each illustrating a respective variation of a mask component of the diffuser unit according to this disclosure.
Figure 11:
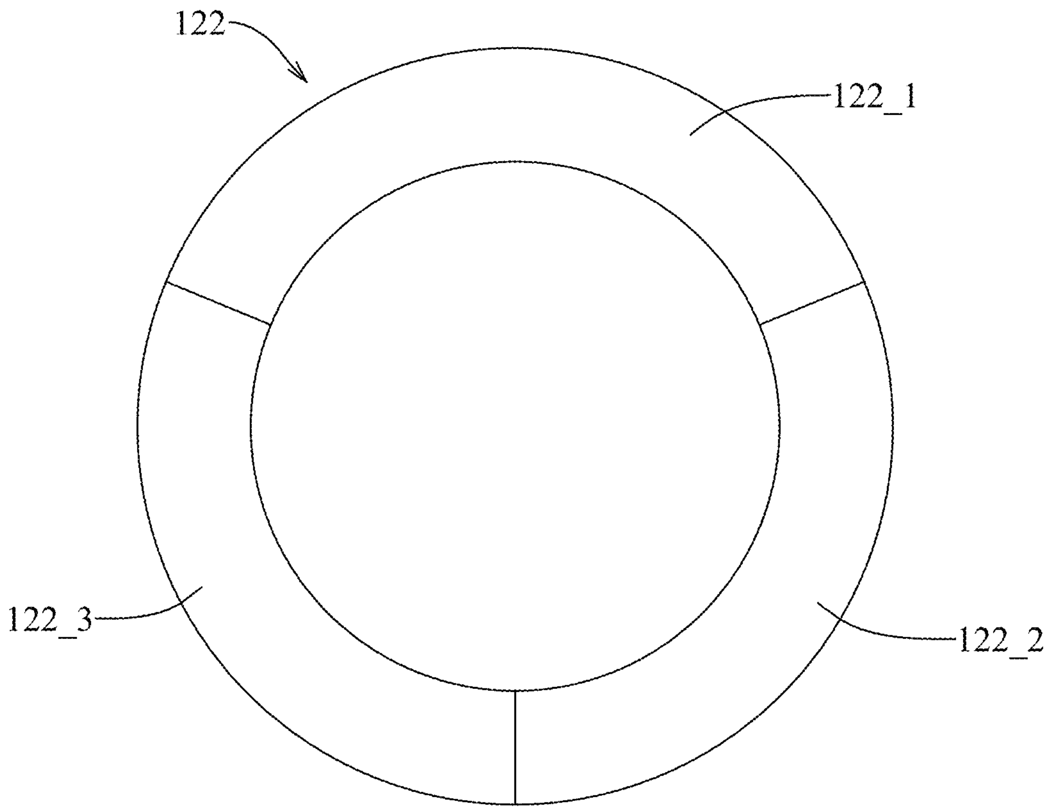
Figure 12:
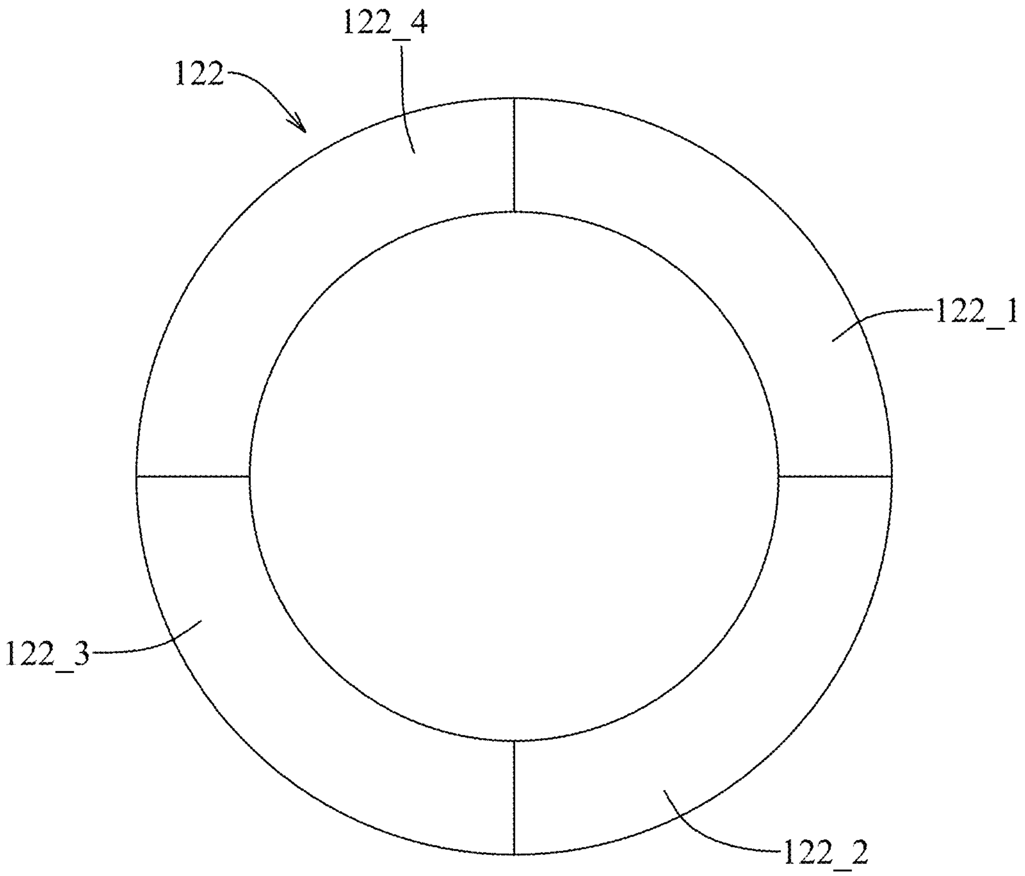
Figure 13:
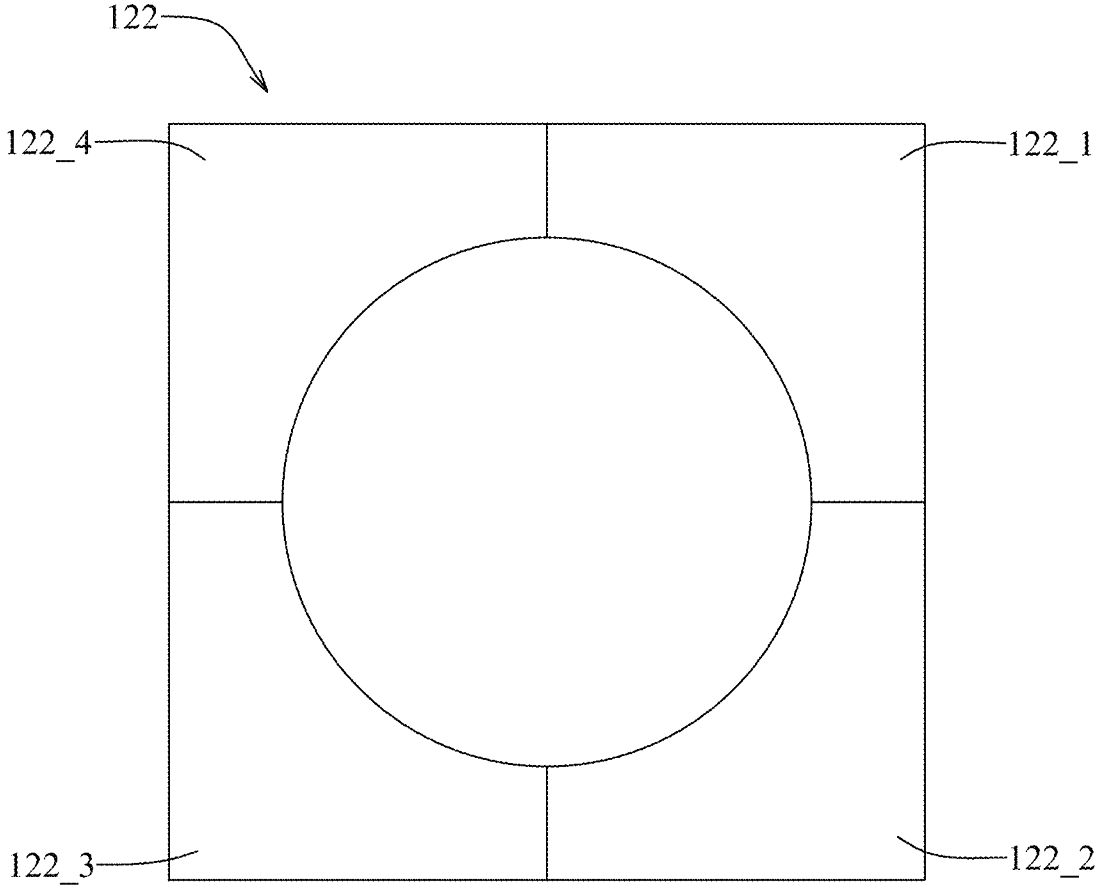

FIG. 10 illustrates a first variation of the mask component 122, where the mask component 122 includes two separable mask pieces 122_1 and 122_2 that are each in a shape of a semi-circular arc. FIG. 11 illustrates a second variation of the mask component 122, where the mask component 122 includes three separable mask pieces 122_1, 122_2 and 122_3. It is noted that the three mask pieces 122_1, 122_2 and 122_3 may subtend the same angle (i.e., 120 degrees) or different angles at a center of the circular mask component 122, and this disclosure is not limited in this respect. FIG. 12 illustrates a third variation of the mask component 122, where the mask component 122 includes four separable mask pieces 122_1, 122_2, 122_3 and 122_4. It is noted that the four mask pieces 122_1, 122_2, 122_3 and 122_4 may subtend the same angle (i.e., 90 degrees) or different angles at the center of the circular mask component 122, and this disclosure is not limited in this respect. FIG. 13 illustrates a fourth variation of the mask component 122, which is similar to the third variation in that the mask component 122 includes four separable mask pieces 122_1, 122_2, 122_3 and 122_4. Unlike the first, second and third variations in which the mask pieces can compose an annular mask component 122, each of the mask pieces 122_1, 122_2, 122_3, 122_4 in the fourth variation has only one arc edge that is configured to define the aperture of the mask component 122, and the other edges are all linear edges. When the mask pieces 122_1, 122_2, 122_3, 122_4 are assembled to complete the mask component 122, the outer peripheral of the mask component 122 would form a polygon (e.g., a square) rather than a circle. In the fourth variation, the resultant mask component 122 has a square outline and is formed with a central circular hole. The first to fourth variations may not only facilitate mounting the diffuser lens 121 to the mask component 122 or removing the diffuser lens 121 from the mask component 122 in some implementations of the first embodiment (e.g., the implementations as shown in FIGS. 6 and 7, where the mask component 122 has a protrusion extending into the diffuser lens 121), but also save space so that less space is required for storing the mask component 122.

Figure 14:
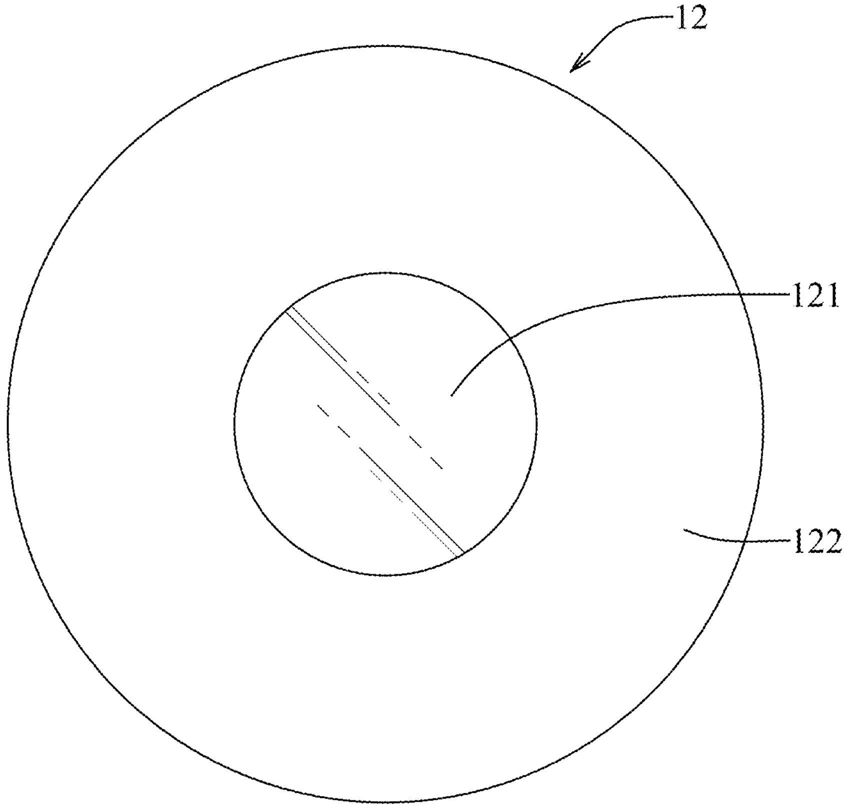
FIG. 14 is a front view of a second embodiment of a diffuser unit of the lithographic system according to this disclosure.

FIG. 14 exemplarily illustrates a front view of the diffuser unit 12 in accordance with a second embodiment. The second embodiment is similar to the first embodiment (see FIG. 3), and differs from the first embodiment in that the diffuser unit 12 of the second embodiment has a smaller aperture than the diffuser unit 12 of the first embodiment.

Figure 15:
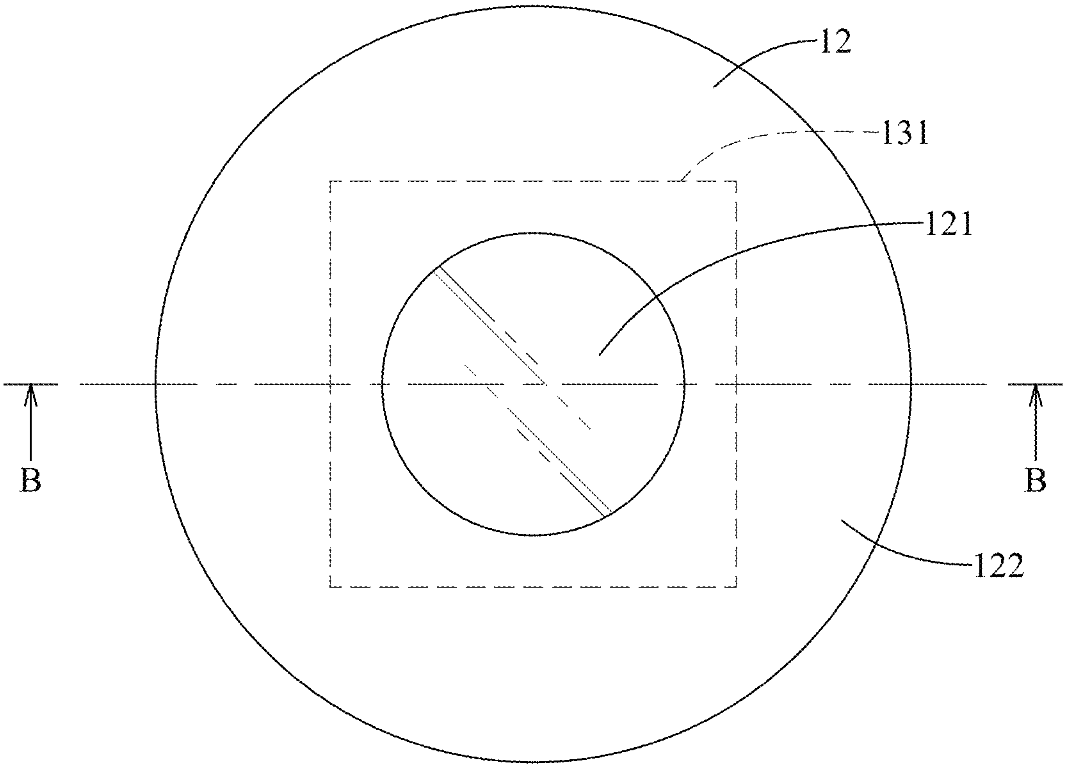
FIG. 15 is a front view of an assembly of the light pipe unit and the second embodiment of the diffuser unit according to this disclosure.

FIG. 15 exemplarily illustrates a front view of an assembly of the diffuser unit 12 as shown in FIG. 14 and the light pipe unit 13 as shown in FIG. 2. The diffuser unit 12 is mounted to the inlet end of the light pipe unit 13, and the aperture of the diffuser unit 12 is aligned with the aperture of the light pipe unit 13. In the illustrative embodiment, the diameter of the aperture of the diffuser unit 12 is smaller than the side length of the aperture of the inlet end of the light pipe unit 3, so the pipe housing 132 is unobservable through the diffuser lens 121.

Figure 16:
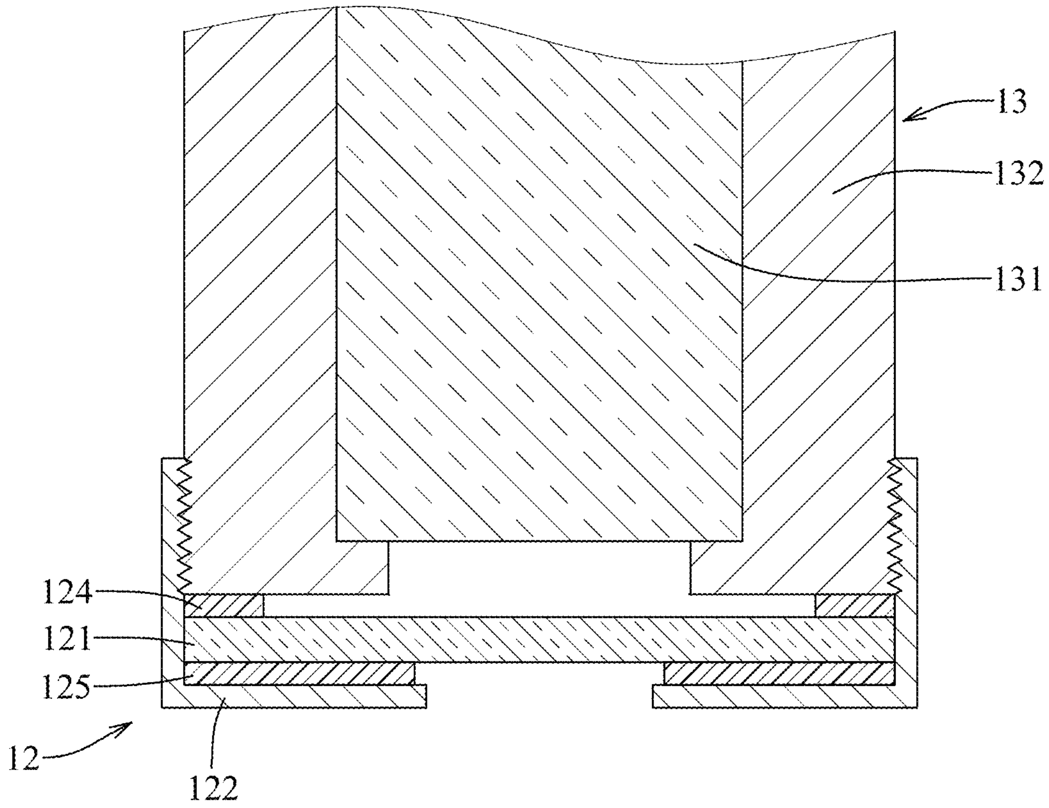
FIGS. 16 through 20 are sectional views each illustrating the assembly of the light pipe unit and a respective implementation of the diffuser unit in the second embodiment, taken along line B-B in FIG. 15.

FIG. 16 is a sectional view taken along line B-B in FIG. 15, illustrating a first implementation of the assembly of the diffuser unit 12 and the light pipe unit 13 in accordance with the second embodiment. The first implementation of the second embodiment is similar to the first implementation of the first embodiment as shown in FIG. 5, and differs in that the mask component 122 in FIG. 16 has a smaller aperture than the mask component 122 in FIG. 5, while the diffuser lens 121 in FIG. 16 has the same size as the diffuser lens 121 in FIG. 5. The light pipe 131 is surrounded by the pipe housing 132, and has a central portion aligned with the aperture of the pipe housing 132, a central portion of the diffuser lens 121, and the aperture of the mask component 122. The diffuser lens 121 is spaced apart from the pipe housing 132 and the mask portion of the mask component 122 by the first cushioning member 124 and the second cushioning member 125, respectively. The threaded engagement and the cushioning members 124, 125 allow the diffuser lens 121 to be firmly secured between the mask component 122 and the light pipe unit 13.

Figure 17:
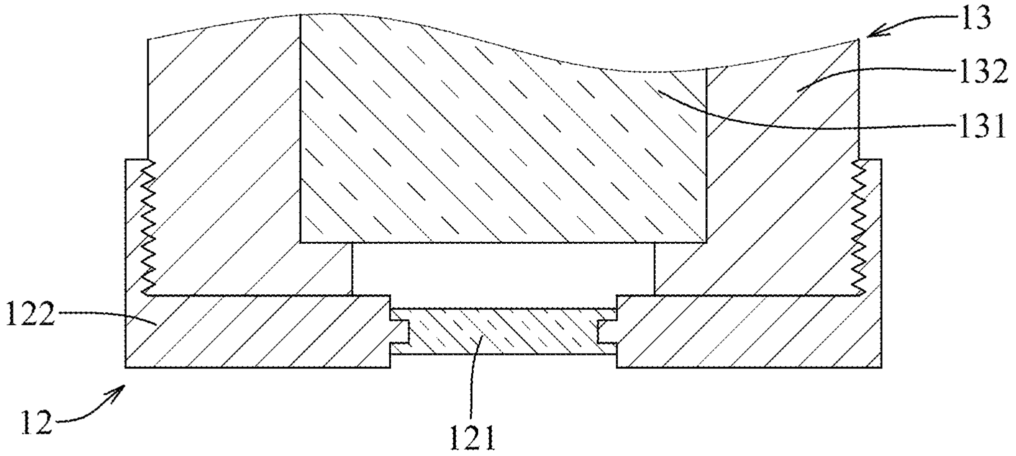

FIG. 17 is a sectional view taken along line B-B in FIG. 15, illustrating a second implementation of the assembly of the diffuser unit 12 and the light pipe unit 13 in accordance with the second embodiment. The second implementation of the second embodiment is similar to the second implementation of the first embodiment as shown in FIG. 6 where the diffuser lens 121 has an annular groove formed in the peripheral surface thereof to accommodate the annular protrusion of the mask component 122, and differs in that the diffuser lens 121 in FIG. 17 is smaller than the diffuser lens 121 in FIG. 6. Specifically, the size of the diffuser lens 121 is the same as the aperture of the diffuser unit 12 in the second implementation, so a diameter of the diffuser lens 121 is smaller than the side length of the aperture of the light pipe unit 13.

Figure 18:
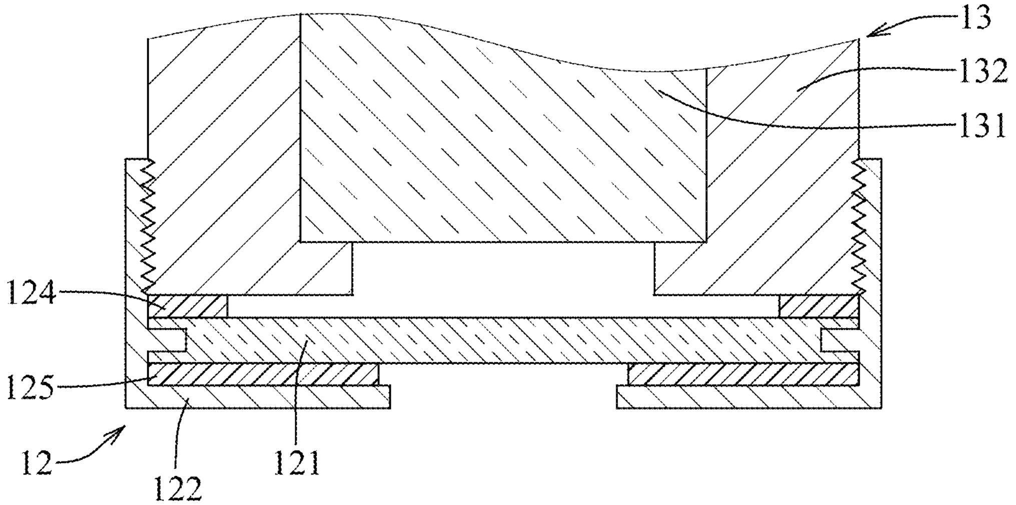

FIG. 18 is a sectional view taken along line B-B in FIG. 15, illustrating a third implementation of the assembly of the diffuser unit 12 and the light pipe unit 13 in accordance with the second embodiment. The third implementation of the second embodiment is similar to the third implementation of the first embodiment as shown in FIG. 7, and differs in that the mask component 122 in FIG. 18 has a smaller aperture than the mask component 122 in FIG. 7, while the diffuser lens 121 in FIG. 18 has the same size as the diffuser lens 121 in FIG. 7. In the illustrative embodiment, the first cushioning member 124 has the same size as the first cushioning member 124 in FIG. 7, and the second cushioning member 125 is wider than the second cushioning member 125 in FIG. 7 because the mask portion of the mask component 122 in FIG. 18 is larger, so as to provide sufficient protection for the diffuser lens 121.

Figure 19:
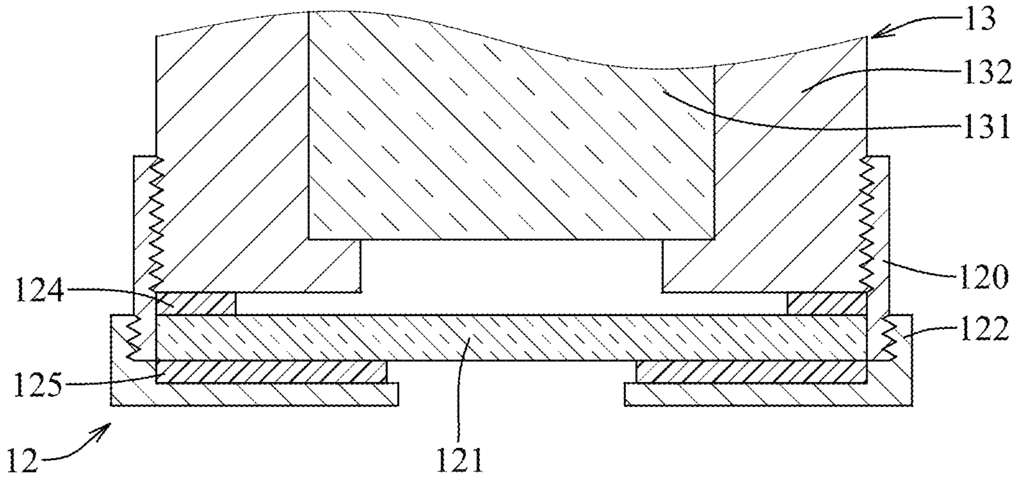

FIG. 19 is a sectional view taken along line B-B in FIG. 15, illustrating a fourth implementation of the assembly of the diffuser unit 12 and the light pipe unit 13 in accordance with the second embodiment. The fourth implementation of the second embodiment is similar to the fourth implementation of the first embodiment as shown in FIG. 8, where the connecting tube 120 is sleeved on the pipe housing 132, and the mask component 122 is sleeved on the connecting tube 120. The mask component 122 in FIG. 19 has a smaller aperture than the mask component 122 in FIG. 8, while the diffuser lens 121 in FIG. 19 has the same size as the diffuser lens 121 in FIG. 8. In the illustrative embodiment, the first cushioning member 124 has the same size as the first cushioning member 124 in FIG. 8, and the second cushioning member 125 is wider than the second cushioning member 125 in FIG. 8 because the mask portion of the mask component 122 in FIG. 19 is larger, so as to provide sufficient protection for the diffuser lens 121.

Figure 20:
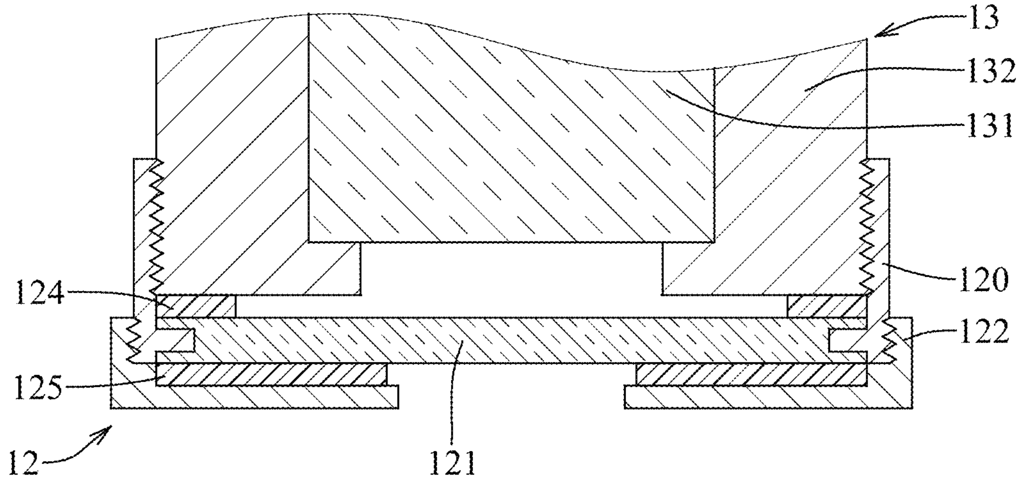

FIG. 20 is a sectional view taken along line B-B in FIG. 15, illustrating a fifth implementation of the assembly of the diffuser unit 12 and the light pipe unit 13 in accordance with the second embodiment. The fifth implementation of the second embodiment is similar to the fifth implementation of the first embodiment as shown in FIG. 9, where the connecting tube 120 is sleeved on the pipe housing 132, the mask component 122 is sleeved on the connecting tube 120, and the connecting tube 120 has an annular protrusion embedded in the annular groove that is formed in the peripheral surface of the diffuser lens 121. The mask component 122 in FIG. 20 has a smaller aperture than the mask component 122 in FIG. 9, while the diffuser lens 121 in FIG. 20 has the same size as the diffuser lens 121 in FIG. 9. In the illustrative embodiment, the first cushioning member 124 has the same size as the first cushioning member 124 in FIG. 9, and the second cushioning member 125 is wider than the second cushioning member 125 in FIG. 9 because the mask portion of the mask component 122 in FIG. 20 is larger, so as to provide sufficient protection for the diffuser lens 121.

Figure 21:
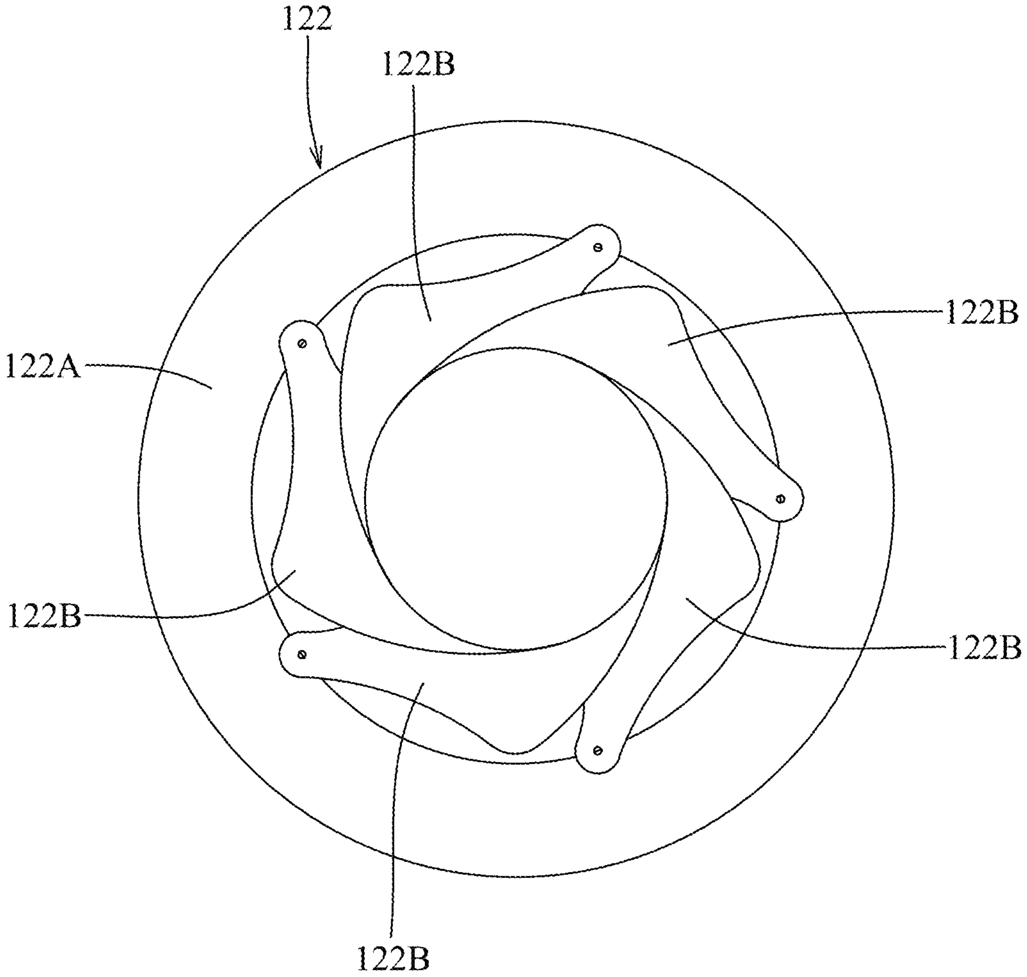
FIGS. 21 and 22 are front views illustrating another variation of the mask component of the diffuser unit according to this disclosure.
Figure 22:
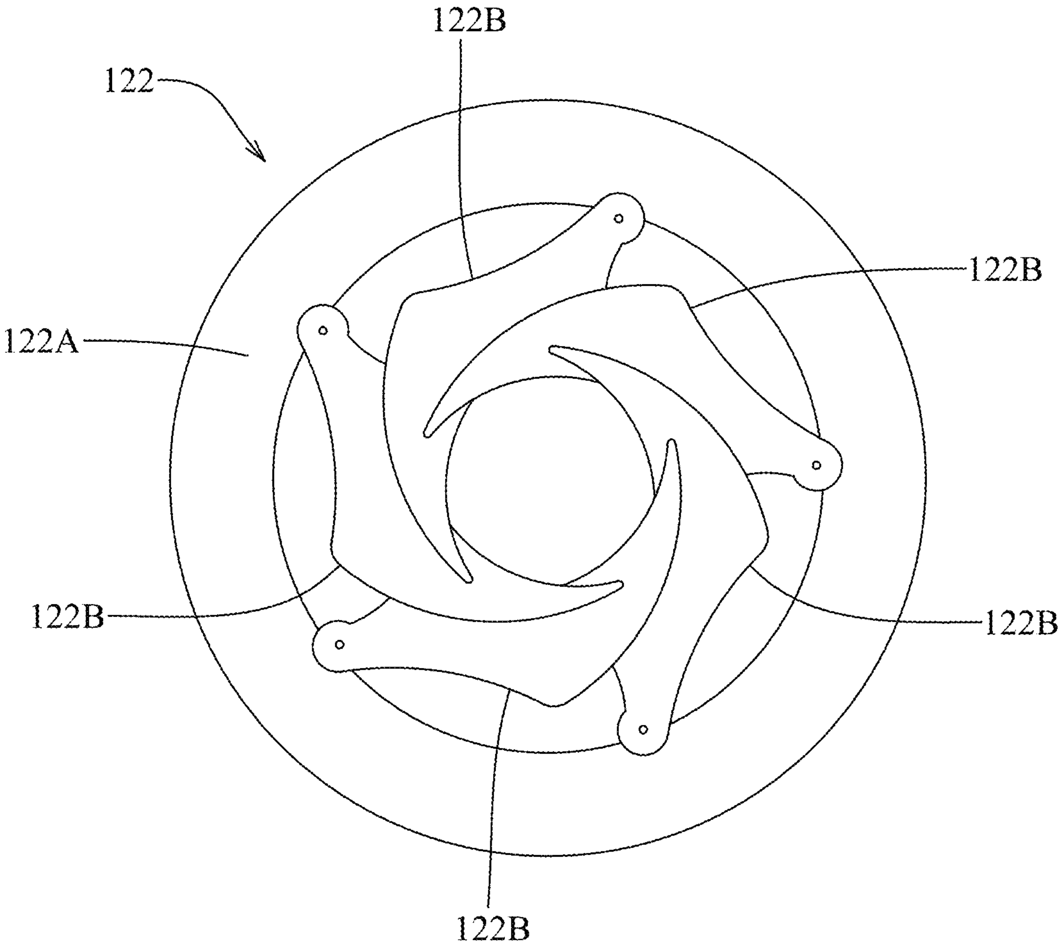

FIG. 21 illustrates a front view of a variation of the mask component 122 of the diffuser unit 12 according to this disclosure, where the mask component 122 has a variable aperture by virtue of including an annular base 122A, and a plurality of blades 122B that are pivotally connected to the annular base 122A. The blades 122B are movable to change the aperture of the mask component 122. In the illustrative embodiment, each of the blades 122B includes a connecting end that is pivotally connected to the annular base 122A, and has a convex outer edge and a concave inner edge. The concave inner edges of the blades 122B cooperatively define the aperture of the mask component 122. FIG. 22 illustrates that the blades 122B have each rotated in a counterclockwise direction from the position as shown in FIG. 21 to collectively form a smaller aperture of the mask component 122.

Figure 23:
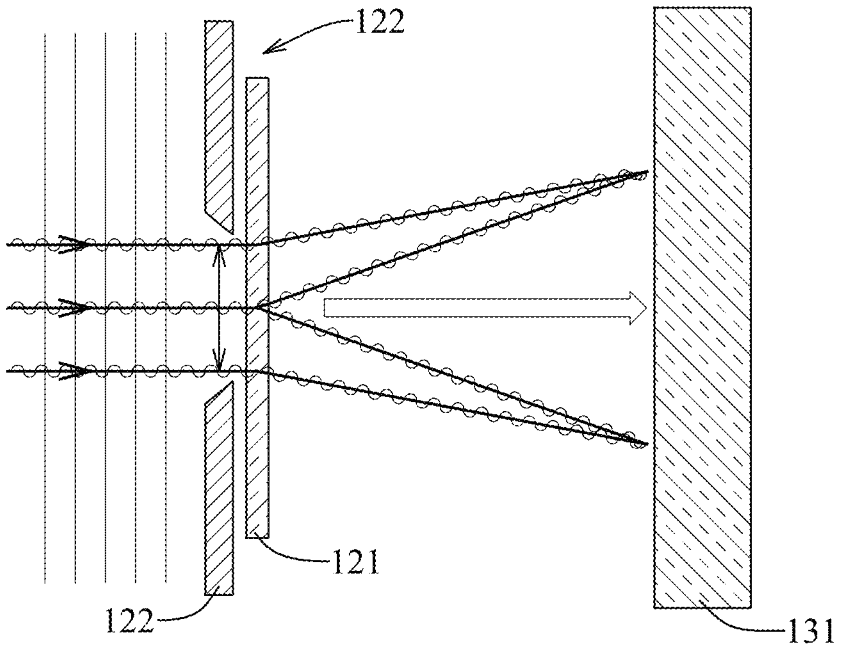
FIGS. 23 and 24 are schematic diagrams illustrating transmission and diffraction of light passing through the diffuser units of different apertures according to this disclosure.
Figure 24:
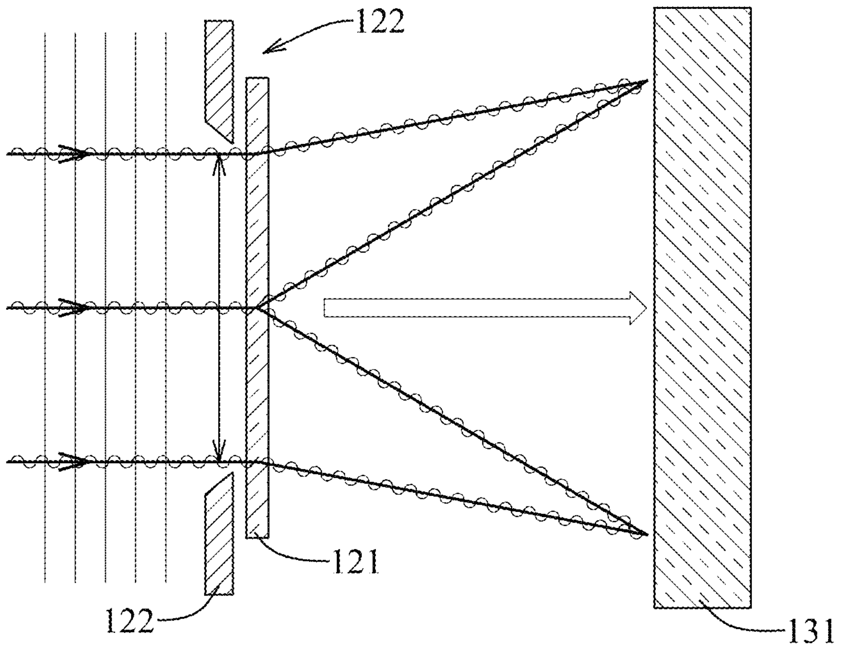

FIGS. 23 and 24 illustrate transmission of light through the diffuser unit 12 with different apertures, where the aperture of the mask component 122 in FIG. 24 is larger than the aperture of the mask component 122 in FIG. 23. When the light beam is incident on the mask component 122 with the larger aperture, not only do more light rays pass directly through the mask component 122, but also the diffracted light rays of different orders become more concentrated, even overlapping to form a larger central bright spot. As a result, more light enters the light pipe 131 when the mask component 122 has a greater aperture, which may result in greater light irradiance on the wafer 3 (see FIG. 1).

Figure 25:
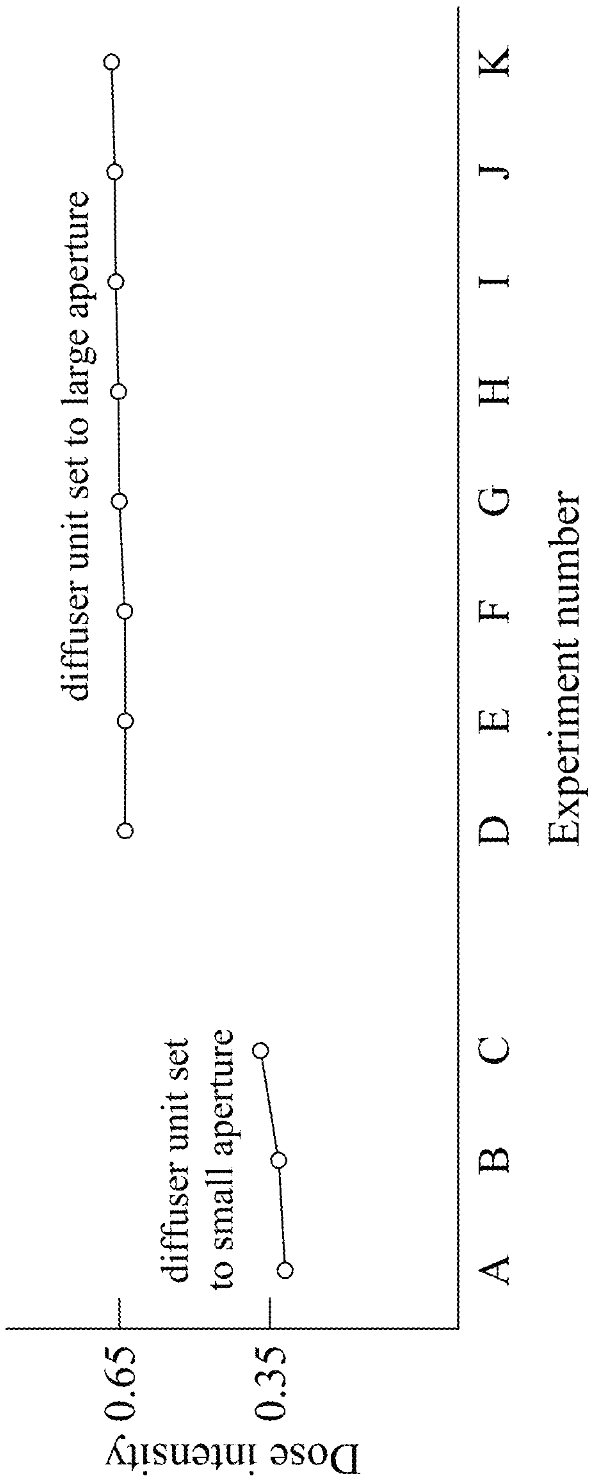
FIG. 25 is a plot illustrating experimental results of using the diffuser units of different apertures according to this disclosure.

FIG. 25 illustrates experiment results that compare dose intensities exerted on wafers using the lithographic system 1 with the numerical aperture component 16 (see FIG. 1) being set to a small numerical aperture value (e.g., 0.48), and the diffuser unit 12 (see FIG. 1) being set to different apertures. In experiments A to C, the diffuser unit 12 was set to a small aperture (e.g., using the diffuser units 12 of the second embodiment as shown in FIGS. 16 to 20); and in experiments D to K, the diffuser unit 12 was set to a large aperture (e.g., using the diffuser units 12 of the first embodiment as shown in FIGS. 5 to 9). In these experiments, the aperture of the diffuser units 12 used in experiments D to K was about five times the aperture of the diffuser units 12 used in experiments A to C in size, and FIG. 25 shows that the dose intensities exerted on the wafers in the experiments D to K are about 1.85 times that of the dose intensities exerted on the wafers in the experiments A to C (about 65% of the intensity of the initial light beam versus 35% of the intensity of the initial light beam). In some lithographic processes, such as an exposure process to form a pattern of metal features (e.g., a pattern of metal lines, a pattern of metal vias, etc.), the photomask layer may be relatively thick, requiring higher energy for the exposure process. However, the higher energy during exposure may induce a lens heating effect that may cause image distortion. In order to create a larger process window to alleviate the lens heating effect, it is preferred to increase a depth of focus (DOF) of the lithographic process by reducing the numerical aperture of the numerical aperture component 16 because the depth of focus is inversely proportional to the square of the numerical aperture. On the other hand, the resolution of exposure is inversely proportional to the numerical aperture (noting that the resolution is the smaller the better), and a smaller numerical aperture may lead to a poorer resolution of exposure. The greater dose intensity that can be achieved by using the diffuser unit 12 of a greater aperture may compensate for the side effect caused by the smaller numerical aperture, and result in better stability for critical dimensions (e.g., the widths of metal lines, the spacing between metal lines, the sizes of metal vias, etc.) during exposure.

Figure 26:
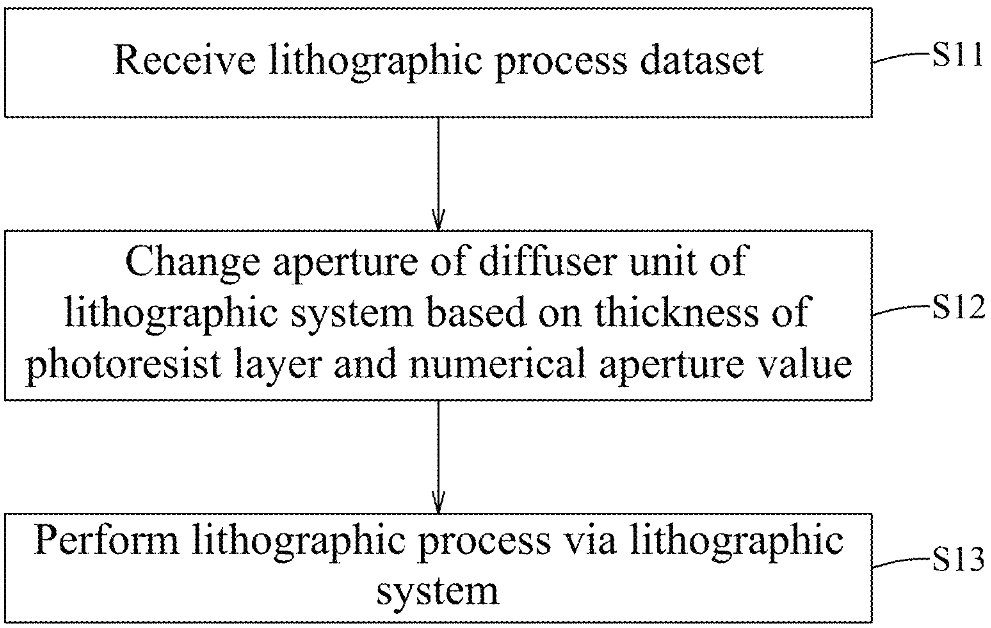
FIG. 26 is a flow chart illustrating steps of an embodiment of a method of using the lithographic system to perform lithography according to this disclosure.

FIG. 26 illustrates a method of using a lithographic system 1 to perform lithography in accordance with some embodiments, where the lithographic system 1 is exemplified as that shown in FIG. 1.

In step S11, a lithographic process dataset is received through a computer device (not shown) by a user (e.g., a lithography engineer, an operator of the lithographic system 1, etc.) who is ready to operate the lithographic system 1 to perform a lithographic process on the wafer 3 coated with a photoresist layer, where the lithographic process dataset is related to the lithographic process. In accordance with some embodiments, the lithographic process dataset includes a thickness of the photoresist layer and a process recipe that contains a numerical aperture value of the numerical aperture component 16 to be used in the lithographic process.

In step S12, the aperture of the diffuser unit 12 is changed by the user based on the thickness of the photoresist layer and the numerical aperture value of the numerical aperture component 16. For example, when the numerical aperture value to be used in the lithographic process is not greater than a predetermined numerical aperture value (e.g., falling in a range between the predetermined numerical aperture value and a lower limit value of an adjustable range of the numerical aperture value of the numerical aperture component 16, which means that the numerical aperture value is small) and the thickness of the photoresist layer is greater than a predefined thickness value (which means that the photoresist layer is thick), the aperture of the diffuser unit 12 is changed to be larger than a standard aperture value (e.g., a default value set by a manufacturer of the lithographic system 1) by changing, for example, the diffuser unit 12 of the second embodiment (see FIGS. 16 to 20) to the diffuser unit 12 of the first embodiment (see FIGS. 5 to 9). As a result, the final dose intensity of light exerted on the wafer 3 can be increased. In accordance with some embodiments, the lithographic process that fulfills both the small numerical aperture value and the thick photoresist layer is often an exposure process to form a pattern of metal features, such as metal lines or metal vias.

In the case where the diffuser lens 121 is equal to the aperture of the mask component 122 in size and thus defines the aperture of the diffuser unit 12 as illustrated in FIGS. 6 and 17, changing the aperture of the diffuser unit 12 may involve detaching the currently mounted diffuser unit 12 from the inlet end of the light pipe unit 13, and mounting another diffuser unit 12 to the inlet end of the light pipe unit 13, such as detaching the diffuser unit 12 of the second embodiment as shown in FIG. 17 from the inlet end of the light pipe unit 13 and then mounting the diffuser unit 12 of the first embodiment as shown in FIG. 6 to the inlet end of the light pipe unit 13 when the aperture of the diffuser unit 12 needs to be made larger.

In some cases where the aperture of the diffuser unit 12 is defined by the aperture of the mask component 122 as shown in FIGS. 5 and 16, FIGS. 7 and 18, FIGS. 8 and 19, or FIGS. 9 and 20, changing the aperture of the diffuser unit 12 changes the aperture of the mask component 122, which may involve only changing from one mask component 122 to another mask component 122 having a different aperture, such as changing the mask component 122 of the second embodiment as shown in FIG. 16, 18, 19 or 20 to the mask component 122 of the first embodiment as shown in FIG. 5, 7, 8 or 9 when the aperture of the diffuser unit 12 is to be increased. In these implementations, the mask component 122 of different apertures may share the same diffuser lens 122 to obtain the diffuser unit 12 of different apertures, and the material cost can be saved.

In the case where the diffuser unit 12 is configured in the form as illustrated in FIGS. 5 and 16 or in FIGS. 7 and 18, the aperture of the mask component is changed 122 by detaching the currently mounted mask component 122 from the inlet end of the light pipe unit 13, and mounting another mask component 122 having a different aperture to the inlet end of the light pipe unit 13.

In the case where the diffuser unit 12 is configured in the form as illustrated in FIGS. 8 and 19 or in FIGS. 9 and 20, the changing of the aperture of the mask component 122 is to disengage the currently mounted mask component 122 from the connecting tube 120, and then engage another mask component 122 having a different aperture with the connecting tube 120. Since the connecting tube 120 is not needed to be disengaged from the light pipe unit 13 during the changing of the aperture of the diffuser unit 12, the wearing of the pipe housing 132 can be minimized, thereby prolonging the service life of the pipe housing 132.

In the case where the mask component 122 is configured to have a variable aperture as illustrated in FIGS. 21 and 22, changing the aperture of the mask component 122 may be accomplished by moving the blades 122B. For example, the blades 122B may be rotated in a desired direction (i.e., the clockwise direction or the counterclockwise direction), thereby reducing or enlarging the aperture of the mask component 122.

Referring to FIG. 26 again, after changing the aperture of the diffuser unit 12, the lithographic system 1 is operated by the user to perform the lithographic process on the wafer 3 (step S13) based on the process recipe and with the diffuser unit 12 having the aperture after it was changed in step S12.

Figure 27:
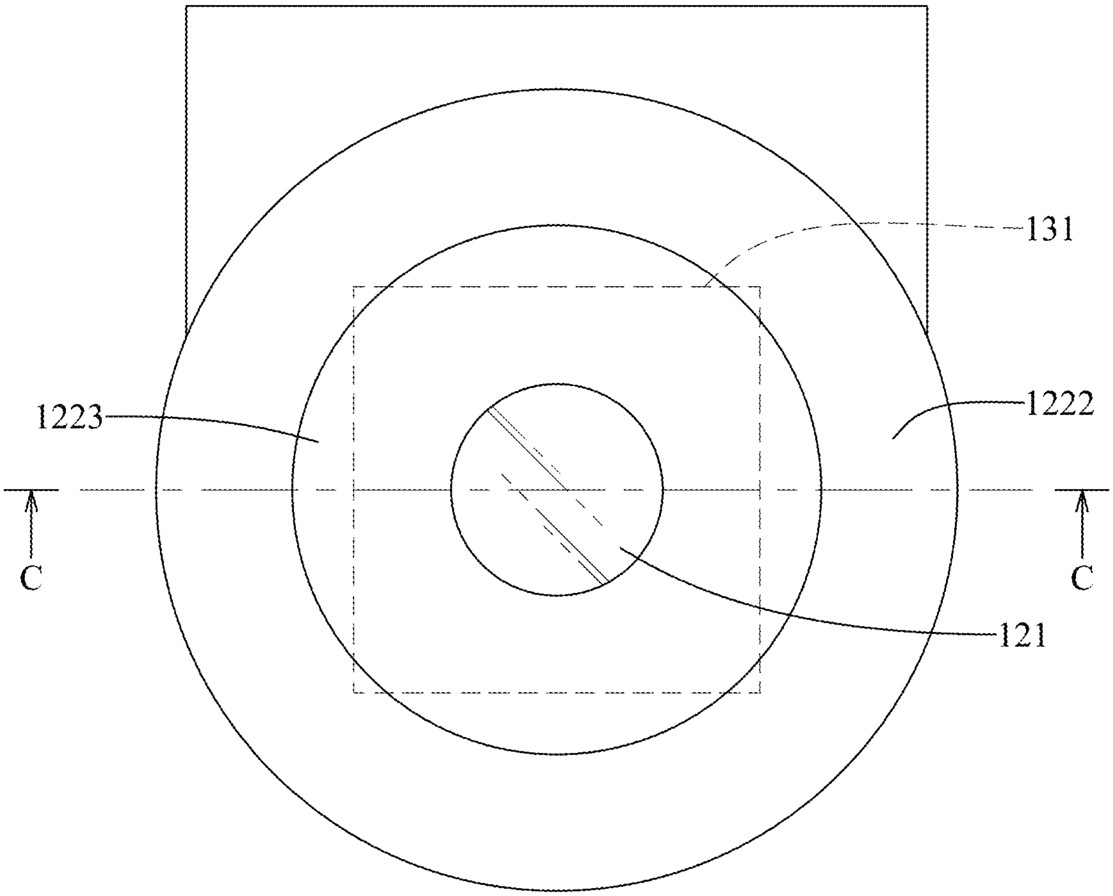
FIG. 27 is a front view of an assembly of the light pipe unit and a third embodiment of the diffuser unit according to this disclosure.
Figure 28:
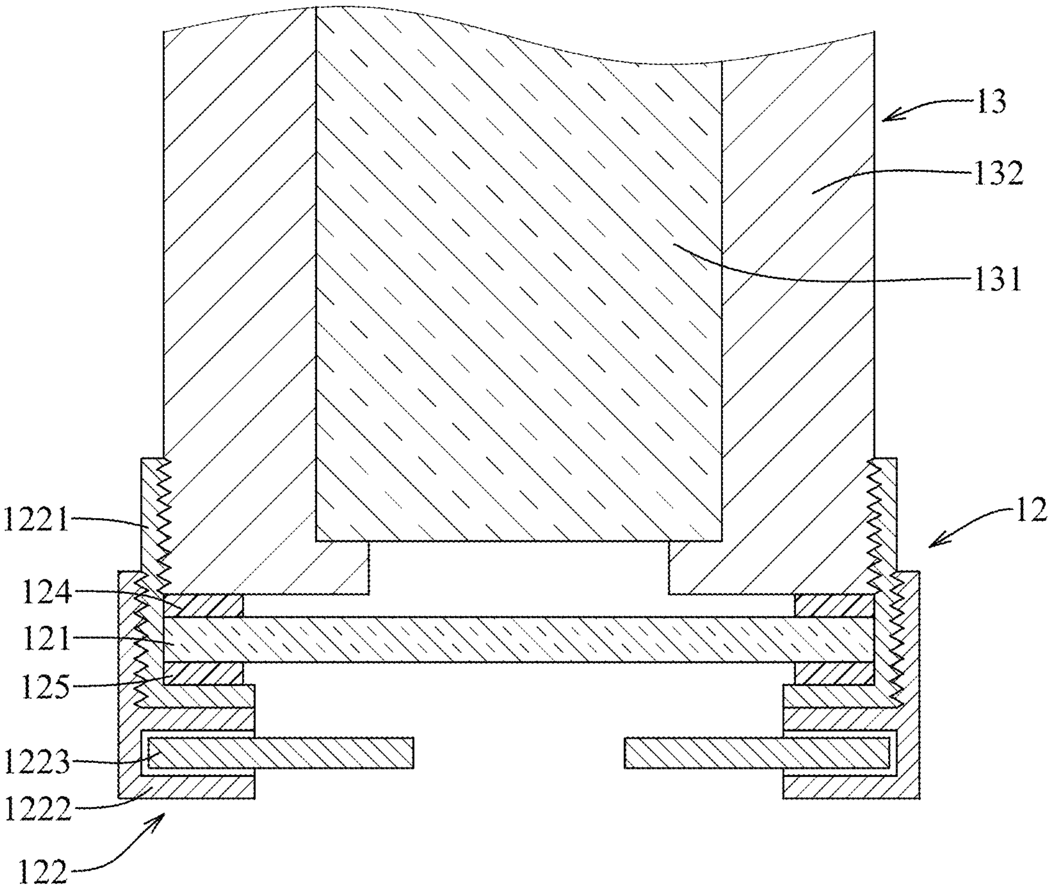
FIG. 28 is a sectional view illustrating the assembly of the light pipe unit and an implementation of the diffuser unit in the third embodiment according to this disclosure.
Figure 29:
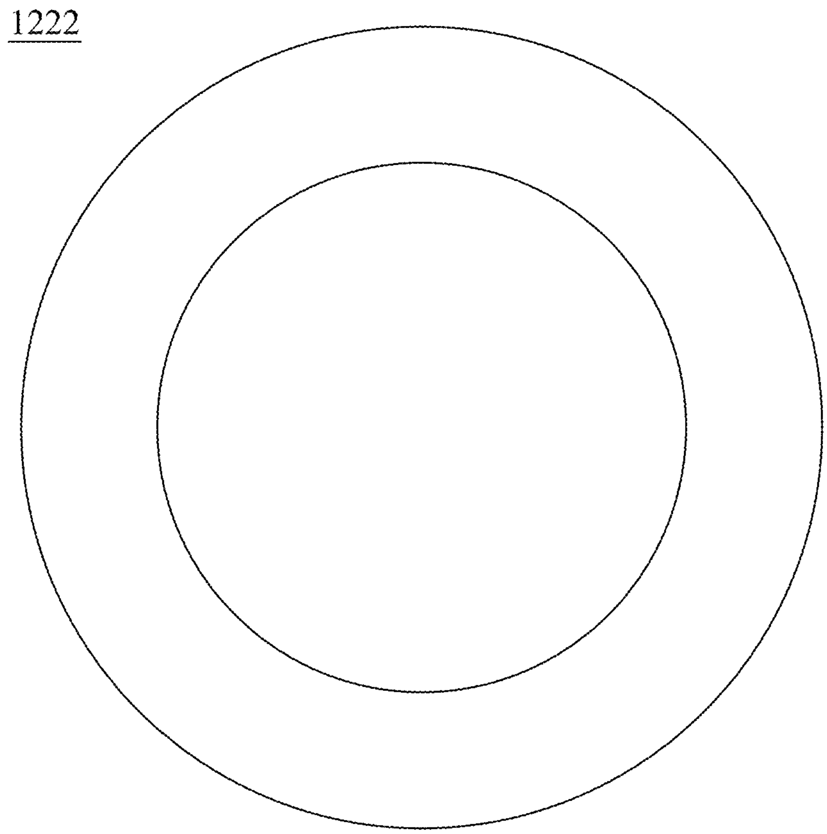
FIG. 29 is a front view of a mask container of the third embodiment of the diffuser unit according to this disclosure.
Figure 30:
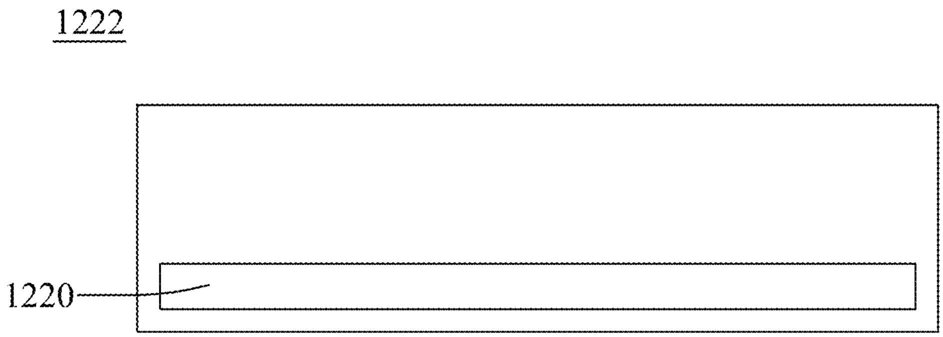
FIG. 30 is a side view of the mask container of the third embodiment of the diffuser unit according to this disclosure.
Figure 31:
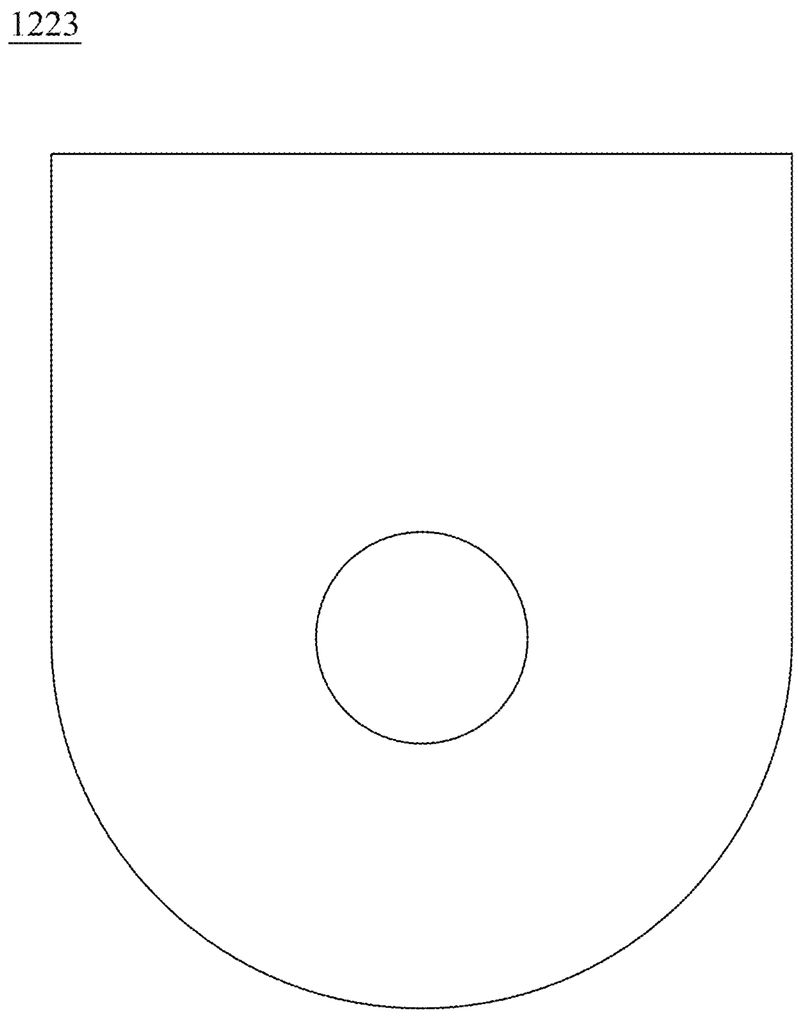
FIG. 31 is a front view of a mask plate of the third embodiment of the diffuser unit according to this disclosure.

FIG. 27 exemplarily illustrates a front view of the diffuser unit 12 in accordance with a third embodiment, and FIG. 28 is a sectional view taken along line C-C in FIG. 27, illustrating a first implementation of the assembly of the diffuser unit 12 and the light pipe unit 13 in accordance with the third embodiment. The third embodiment is similar to the first embodiment (see FIG. 3), and differs from the first embodiment in that the mask component 122 of the third embodiment includes a linking element 1221, a mask container 1222, and a mask plate 1223. The linking element 1221 in FIG. 28 is similar to the mask component 122 in FIG. 5, and differs in that the linking element 1221 has an outer surface formed with threads at a front portion. The mask container 1222 has an inner surface formed with threads at a rear portion for engagement with the linking element 1221. In the illustrative embodiment, the mask container 1222 is mounted to the inlet end of the light pipe unit 13 through the linking element 1221, and the diffuser lens 121 is disposed between the mask container 1222 and the light pipe unit 13. Further referring to FIGS. 29 and 30 that respectively illustrate a front view and a side view of the mask container 1222, the mask container 1222 appears annular and thus has an aperture when viewed from the front, and has a side surface formed with a slot 1220 for insertion of the mask plate 1223. Referring to FIG. 31 that illustrates a front view of the mask plate 1223, the mask plate 1223 has an inserting portion, and an extending portion connected to the inserting portion. The inserting portion is formed with a through hole at a central portion thereof, defining an aperture of the mask plate 1223. The aperture of the mask plate 1223 is smaller than the aperture of the mask container 1222. In the illustrative embodiment, the inserting portion has a curved edge that fits an edge of the mask container 1222 (see FIG. 29), and the extending portion has linear edges, but this disclosure is not limited in this respect. The inserting portion of the mask plate 1223 has a width smaller than a length of the slot 1220 of the mask container 1222 (see FIG. 30), so the inserting portion of the mask plate 1223 can be inserted into the mask container 1222 through the slot 1220, as shown in FIG. 27. In the illustrative embodiment, the mask plate 1223 has a length greater than a diameter of the mask container 1222, so the extending portion of the mask plate 1223 extends out of the mask container 1222 when the mask plate 1223 has been inserted into the mask container 1222, thereby facilitating subsequent removal of the mask plate 1223 from the mask container 1222.

Figure 32:
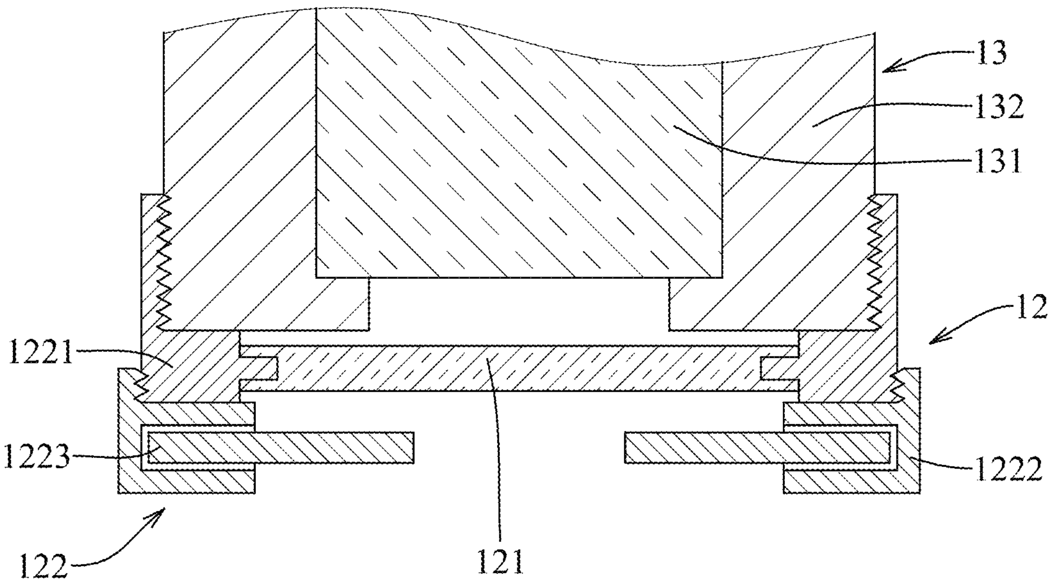
FIGS. 32 through 35 are sectional views each illustrating the assembly of the light pipe unit and a respective implementation of the diffuser unit in the third embodiment.

FIG. 32 is a sectional view taken along line C-C in FIG. 27, illustrating a second implementation of the assembly of the diffuser unit 12 and the light pipe unit 13 in accordance with the third embodiment. The second implementation is similar to the first implementation, and the difference resides in the linking element 1221. The linking element 1221 in the second implementation is similar to the mask component 122 in FIG. 6, and differs in that the linking element 1221 has an outer surface formed with threads at a front portion for engagement with the mask container 1222.

Figure 33:
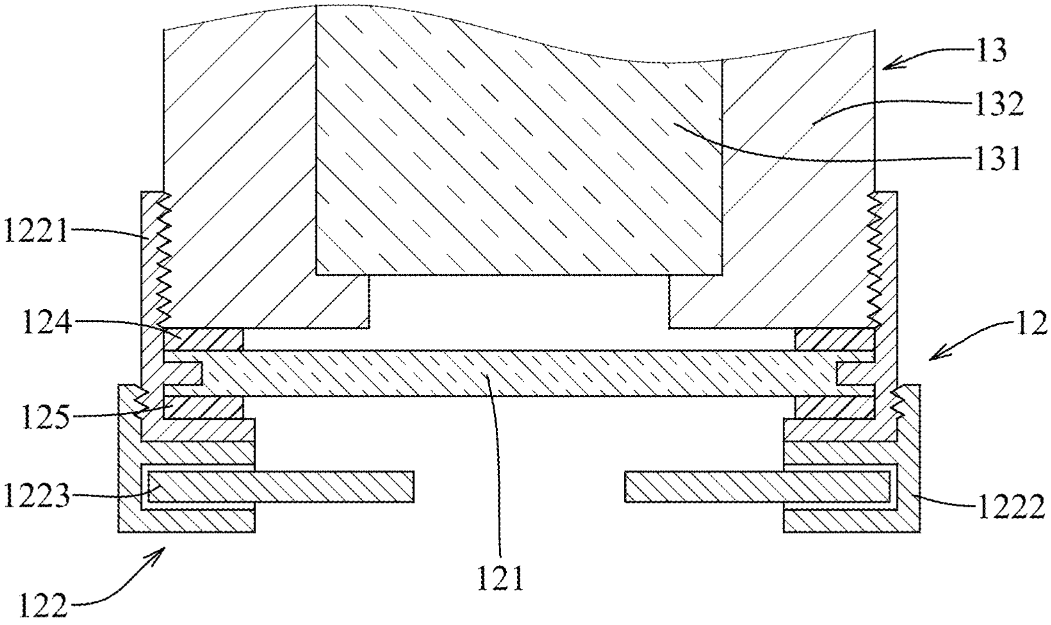

FIG. 33 is a sectional view taken along line C-C in FIG. 27, illustrating a third implementation of the assembly of the diffuser unit 12 and the light pipe unit 13 in accordance with the third embodiment. The third implementation is similar to the first implementation, and differs in that, in the third implementation, the diffuser lens 121 has an annular groove formed in a peripheral surface thereof, and the linking element 1221 has an annular protrusion extending into the groove of the diffuser lens 121, thereby securing the diffuser lens 121 in position more firmly.

Figure 34:
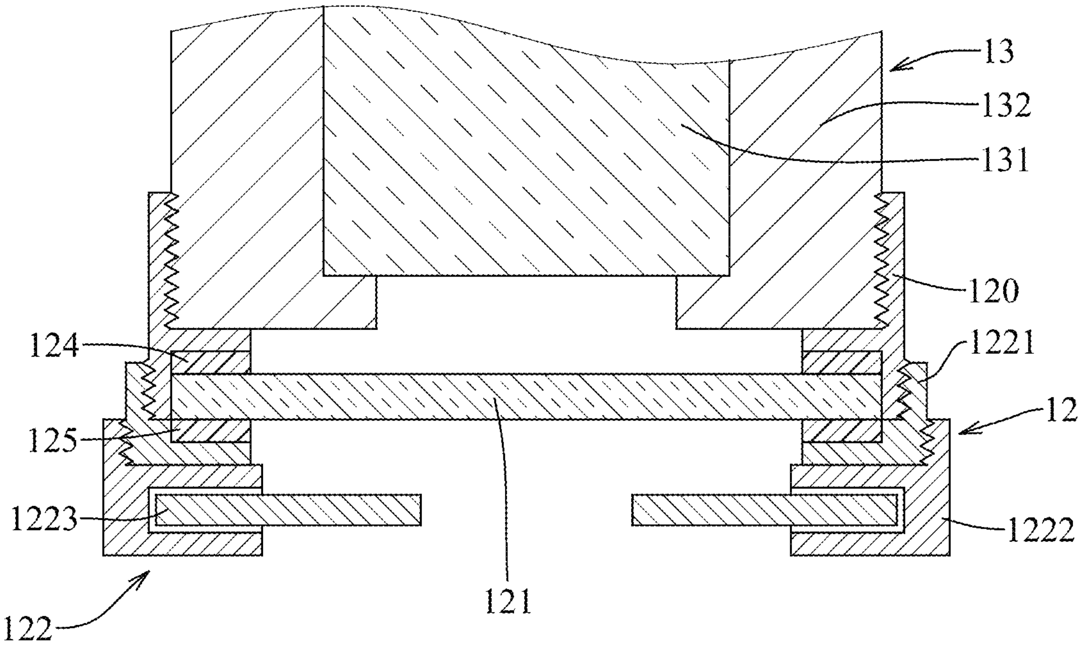

FIG. 34 is a sectional view taken along line C-C in FIG. 27, illustrating a fourth implementation of the assembly of the diffuser unit 12 and the light pipe unit 13 in accordance with the third embodiment. The fourth implementation is similar to the first implementation, and the difference resides in the linking element 1221. The linking element 1221 in the fourth implementation is similar to the mask component 122 in FIG. 8, and differs in that the linking element 1221 has an outer surface formed with threads at a front portion for engagement with the mask container 1222.

Figure 35:
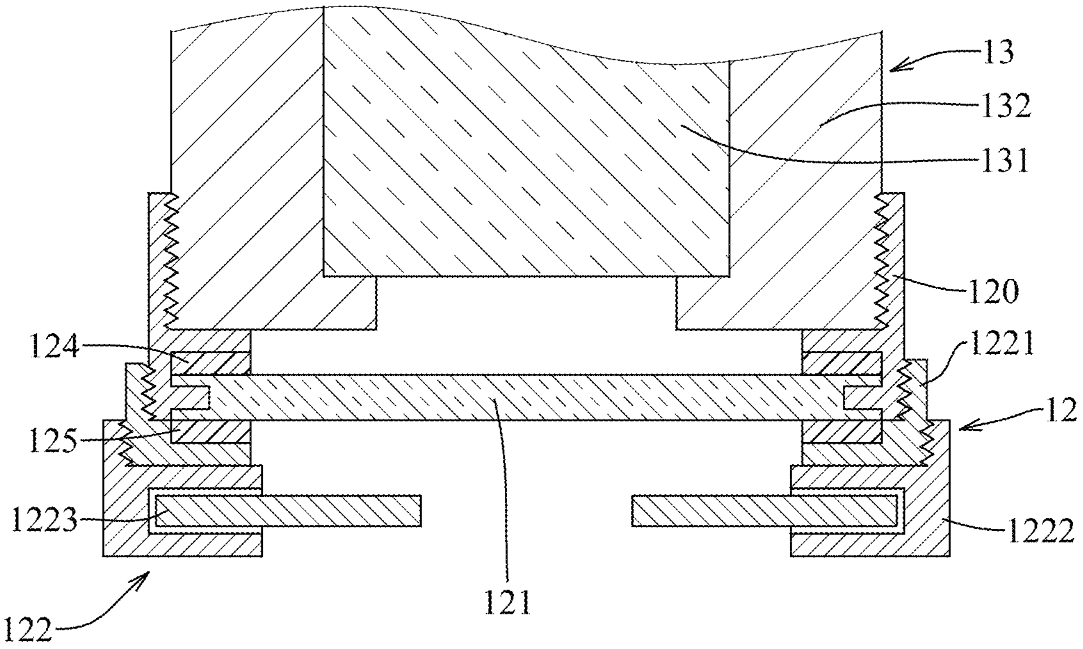

FIG. 35 is a sectional view taken along line C-C in FIG. 27, illustrating a fifth implementation of the assembly of the diffuser unit 12 and the light pipe unit 13 in accordance with the third embodiment. The fifth implementation is similar to the fourth implementation, and differs in that, in the fifth implementation, the diffuser lens 121 has an annular groove formed in a peripheral surface thereof, and the connecting tube 120 has an annular protrusion extending into the groove of the diffuser lens 121, thereby securing the diffuser lens 121 in position more firmly.

By using the mask container 1222 and the mask plate 1223, changing the aperture of the diffuser unit 12 in step S12 (see FIG. 26) can be done easily by replacing the mask plate 1223 in the mask container 1222 with another mask plate 1223 that has a different aperture (i.e., removing the current mask plate 1223 from the mask container 1222, and putting another mask plate 1223 with the desired aperture into the mask container 122), without the need of disengaging and engaging actions.

In practice, the method as illustrated in FIG. 26 may be performed in the following scenario.

In the first place, the lithographic system 1, as illustrated in FIG. 1, is operated to perform a first lithographic process on a first wafer that is coated with a first photoresist layer having a first photoresist thickness smaller than the predefined thickness value. In the first lithographic process, the numerical aperture component 16 is set to have a first numerical aperture value that is not greater than a predetermined numerical aperture value, and the aperture of the diffuser unit 12 is set to a first diffuser aperture value. After the first lithographic process, the lithographic system 1 is operated to perform a second lithographic process on a second wafer that is coated with a second photoresist layer having a second photoresist thickness different from the first photoresist thickness. Herein, it is assumed that the second photoresist thickness is greater than the predefined thickness value, and the numerical aperture component 16 is set to have a second numerical aperture value not greater than the predetermined numerical aperture value. In some scenarios, in order to maximize the depth of focus during the first lithographic process and the second lithographic process, both of the first numerical aperture value and the second numerical aperture value may be set to the lower limit value of the adjustable range of the numerical aperture value of the numerical aperture component 16. In response to the second photoresist layer that is thicker than the first photoresist layer, the aperture of the diffuser unit 12 is set to a second diffuser aperture value greater than the first diffuser aperture value for the second lithographic process. Therefore, between the first lithographic process and the second lithographic process, the aperture of the diffuser unit 12 is adjusted from the first diffuser aperture value to the second diffuser aperture value.

In the case where the diffuser lens 121 is equal in size to the aperture of the mask component 122 and thus defines the aperture of the diffuser unit 12 as illustrated in FIGS. 6 and 17, adjusting the aperture of the diffuser unit 12 involves detaching the currently mounted diffuser unit 12, which has an aperture of the first diffuser aperture value, from the inlet end of the light pipe unit 13, and mounting another diffuser unit 12 that has an aperture of the second diffuser aperture value to the inlet end of the light pipe unit 13.

In the cases where the aperture of the diffuser unit 12 is defined by the aperture of the mask component 122 as shown in FIGS. 5 and 16, FIGS. 7 and 18, FIGS. 8 and 19, or FIGS. 9 and 20, adjusting the aperture of the diffuser unit 12 involves replacing the mask component 122 used in the first lithographic process with another mask component 122 to be used in the second lithographic process, where the aperture of the mask component 122 used in the first lithographic process has the first diffuser aperture value, and the aperture of the mask component 122 to be used in the second lithographic process has the second diffuser aperture value.

In the cases where the mask component 122 is configured to have a variable aperture as illustrated in FIGS. 21 and 22, adjusting the aperture of the diffuser unit 12 involves moving the blades 122B to change the aperture of the mask component 122 from the first diffuser aperture value to the second diffuser aperture value.

In the cases where the mask component 122 includes the mask container 1222 and the mask plate 1223 as illustrated in FIGS. 27 to 35, adjusting the aperture of the diffuser unit 12 involves removing the mask plate 1223 used in the first lithographic process from the mask container 1222, and inserting another mask plate 1223 to be used in the second lithographic process into the mask container 1222, where the aperture of the mask plate 1223 used in the first lithographic process has the first diffuser aperture value, and the aperture of the mask plate 1223 to be used in the second lithographic process has the second diffuser aperture value. In some embodiments where the aperture of the diffuser unit 12 is intended to be maximized, the mask container 1222 may be empty, namely, no mask plate 1223 is placed in the mask container 1222. For example, when the aperture of the diffuser unit 12 is to be maximized in the second lithographic process, the adjusting of the aperture of the diffuser unit 12 may involve only removing the mask plate 1223 used in the first lithographic process from the mask container 1222.

In accordance with some embodiments, a method of using a lithographic system to perform lithography is provided. In one step, a lithographic process dataset is received. The lithographic process dataset is related to a lithographic process to be performed using the lithographic system. The lithographic system includes an illuminator and a projection apparatus. The illuminator includes a diffuser unit having an aperture that is adjustable. In one step, the aperture of the diffuser unit is changed based on a thickness of a photoresist layer coated on a wafer and a numerical aperture value of a numerical aperture component of the projection apparatus. In one step, the lithographic process is performed on the wafer by the lithographic system with the diffuser unit having the aperture thus changed.

In accordance with some embodiments, in the changing of the aperture of the diffuser unit, the aperture of the diffuser unit is changed to be larger than a standard aperture value in response to the numerical aperture value of the numerical aperture component being not greater than a predetermined numerical aperture value and the thickness of the photoresist layer being greater than a predefined thickness value.

In accordance with some embodiments, in the changing of the aperture of the diffuser unit, the aperture of the diffuser unit is changed to be larger than a standard aperture value in response to the lithographic process being an exposure process to form a pattern of metal features.

In accordance with some embodiments, the illuminator further includes a light source unit, a beam shaping unit, a light pipe unit and an exposure control unit, and is configured to output a light beam from the light source unit to a reticle through the beam shaping unit, the diffuser unit, the light pipe unit and the exposure control unit, so that the reticle outputs a patterned light beam. The diffuser unit is mounted to an inlet end of the light pipe unit. The projection apparatus further includes a projection lens assembly, and is configured to receive and project the patterned light beam onto the wafer. The lithographic process dataset includes the thickness of the photoresist layer and the numerical aperture value of the numerical aperture component to be used in the lithographic process. The changing of the aperture of the diffuser unit includes detaching the diffuser unit from the inlet end of the light pipe unit, and mounting another diffuser unit to the inlet end of the light pipe unit. Said another diffuser unit has an aperture different from the aperture of the diffuser unit thus detached.

In accordance with some embodiments, the illuminator further includes a light source unit, a beam shaping unit, a light pipe unit and an exposure control unit, and is configured to output a light beam from the light source unit to a reticle through the beam shaping unit, the diffuser unit, the light pipe unit and the exposure control unit, so that the reticle outputs a patterned light beam. The diffuser unit is mounted to an inlet end of the light pipe unit. The projection apparatus further includes a projection lens assembly, and is configured to receive and project the patterned light beam onto the wafer. The lithographic process dataset includes the thickness of the photoresist layer and the numerical aperture value of the numerical aperture component to be used in the lithographic process. The diffuser unit includes a mask component mounted to the inlet end of the light pipe unit and having an aperture, and a diffuser lens disposed between the mask component and the light pipe unit. The changing of the aperture of the diffuser unit includes changing the aperture of the mask component.

In accordance with some embodiments, the changing of the aperture of the mask component includes detaching the mask component from the inlet end of the light pipe unit, and mounting another mask component to the inlet end of the light pipe unit. Said another mask component has an aperture different from the aperture of the mask component thus detached.

In accordance with some embodiments, the mask component includes a plurality of blades that is movable to change the aperture of the mask component, and the changing of the aperture of the mask component includes moving the blades.

In accordance with some embodiments, the diffuser unit further includes a connecting tube engaged with the inlet end of the light pipe unit and having an aperture that is not smaller than the aperture of the mask component, and the mask component is engaged with the connecting tube. The changing of the aperture of the mask component includes disengaging the mask component from the connecting tube, and engaging another mask component with the connecting tube. Said another mask component has an aperture different from the aperture of the mask component thus disengaged.

In accordance with some embodiments, the mask component includes a mask container mounted to the inlet end of the light pipe unit and having an aperture, and the diffuser lens is disposed between the mask container and the light pipe unit. The changing of the aperture of the mask component includes putting a mask plate into the mask container, the mask plate having an aperture smaller than the aperture of the mask container.

In accordance with some embodiments, the mask component includes a mask container mounted to the inlet end of the light pipe unit and having an aperture, and a mask plate placed in the mask container and having an aperture smaller than the aperture of the mask container. The diffuser lens is disposed between the mask container and the light pipe unit. The changing of the aperture of the mask component includes replacing the mask plate with another mask plate that has an aperture different from the aperture of the mask plate thus replaced.

In accordance with some embodiments, a method of using a lithographic system to perform lithography is provided. The lithographic system includes an illuminator and a projection apparatus. The illuminator includes a light source unit, a beam shaping unit, a diffuser unit, a light pipe unit and an exposure control unit, and is configured to output a light beam from the light source unit to a reticle through the beam shaping unit, the diffuser unit, the light pipe unit and the exposure control unit, so that the reticle outputs a patterned light beam, the diffuser unit being mounted to an inlet end of the light pipe unit. The projection apparatus includes a projection lens assembly and a numerical aperture component, and is configured to receive and project the patterned light beam onto a target wafer. In one step, the lithographic system performs a first lithographic process on a first wafer that serves as the target wafer in the first lithographic process and that is coated with a first photoresist layer having a first photoresist thickness. In the first lithographic process, the numerical aperture component is set to have a first numerical aperture value that is not greater than a predetermined numerical aperture value, and the diffuser unit has an aperture set to a first diffuser aperture value. In one step, the lithographic system performs a second lithographic process on a second wafer that serves as the target wafer in the second lithographic process and that is coated with a second photoresist layer having a second photoresist thickness greater than the first photoresist thickness. In the second lithographic process, the numerical aperture component is set to have a second numerical aperture value that is not greater than the predetermined numerical aperture value, and the aperture of the diffuser unit is set to a second diffuser aperture value greater than the first diffuser aperture value.

In accordance with some embodiments, the second lithographic process is performed after the performing of the first lithographic process. Between the performing of the first lithographic process and the performing of the second lithographic process, the aperture of the diffuser unit is adjusted from the first diffuser aperture value to the second diffuser aperture value.

In accordance with some embodiments, the diffuser unit includes a mask component, and a diffuser lens disposed between the mask component and the light pipe unit. The mask component includes a plurality of blades that is movable to change an aperture of the mask component, and the adjusting of the aperture of the diffuser unit includes moving the blades to change the aperture of the mask component from the first diffuser aperture value to the second diffuser aperture value.

In accordance with some embodiments, the second lithographic process is performed after the performing of the first lithographic process. Between the performing of the first lithographic process and the performing of the second lithographic process, the diffuser unit of which the aperture is of the first diffuser aperture value is detached from the inlet end of the light pipe unit, and another diffuser unit that has an aperture of the second diffuser aperture value is mounted to the inlet end of the light pipe unit. The diffuser unit of which the aperture is of the first diffuser aperture value includes a first diffuser lens having an area equal to an area of the aperture of the diffuser unit. The another diffuser unit of which the aperture is of the second diffuser aperture value includes a second diffuser lens having an area equal to an area of the aperture of the another diffuser unit.

In accordance with some embodiments, the diffuser unit used in the first lithographic process includes a first mask component mounted to the inlet end of the light pipe unit and having an aperture of the first diffuser aperture value, and a diffuser lens disposed between the first mask component and the light pipe unit. The second lithographic process is performed after the performing of the first lithographic process. Between the performing of the first lithographic process and the performing of the second lithographic process, the first mask component is replaced with a second mask component that has an aperture of the second diffuser aperture value.

In accordance with some embodiments, the replacing of the first mask component includes detaching the first mask component from the inlet end of the light pipe unit, and mounting the second mask component to the inlet end of the light pipe unit.

In accordance with some embodiments, the diffuser unit further includes a connecting tube engaged with the inlet end of the light pipe unit and having an aperture that is not smaller than each of the first diffuser aperture value and the second diffuser aperture value. The first mask component is engaged with the connecting tube in the first lithographic process, and the second mask component is engaged with the connecting tube in the second lithographic process.

In accordance with some embodiments, the diffuser unit includes a mask component, and a diffuser lens disposed between the mask component and the light pipe unit. The mask component includes a mask container mounted to the inlet end of the light pipe unit and having an aperture not smaller than each of the first diffuser aperture value and the second diffuser aperture value, and the diffuser lens is disposed between the mask container and the light pipe unit. In the first lithographic process, the mask component further includes a first mask plate that has an aperture of the first diffuser aperture value and that is placed in the mask container. The second lithographic process is performed after the performing of the first lithographic process. Between the performing of the first lithographic process and the performing of the second lithographic process, the first mask plate is removed from the mask container.

In accordance with some embodiments, a lithographic system is provided to include an illuminator and a projection apparatus. The illuminator includes a light source unit, a beam shaping unit, a diffuser unit, a light pipe unit, an exposure control unit. The light source unit is disposed to emit an initial light beam. The beam shaping unit is disposed to receive and modify the initial light beam, thereby outputting a first modified light beam. The diffuser unit has an aperture that is adjustable, and is disposed to receive and modify the first modified light beam, thereby outputting a second modified light beam. The light pipe unit is disposed to receive and modify the second modified light beam, thereby outputting a third modified light beam The light pipe unit has an inlet end to which the diffuser unit is mounted. The exposure control unit is disposed to receive and modify the third modified light beam, thereby outputting a fourth modified light beam to a reticle. The projection apparatus includes a projection lens assembly and a numerical aperture component. The projection lens assembly is disposed to receive and modify a patterned light beam that is outputted by the reticle modifying the fourth modified light beam, thereby outputting a fifth modified light beam. The numerical aperture component has a numerical aperture, and is operable to permit passage of the fifth modified light beam to be projected onto a wafer.

In accordance with some embodiments, the diffuser unit includes a mask component mounted to the inlet end of the light pipe unit, and a diffuser lens disposed between the mask component and the light pipe unit. The mask component is configured to have an aperture that is adjustable.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of using a lithographic system to perform lithography, comprising:

receiving a lithographic process dataset related to a lithographic process to be performed using the lithographic system, wherein the lithographic system includes an illuminator and a projection apparatus, and wherein the illuminator includes a diffuser unit having an aperture that is adjustable;

changing the aperture of the diffuser unit based on a thickness of a photoresist layer coated on a wafer and a numerical aperture value of a numerical aperture component of the projection apparatus; and performing the lithographic process on the wafer by the lithographic system with the diffuser unit having the aperture thus changed.

2. The method according to claim 1, wherein, in the changing of the aperture of the diffuser unit, the aperture of the diffuser unit is changed to be larger than a standard aperture value in response to the numerical aperture value of the numerical aperture component being not greater than a predetermined numerical aperture value and the thickness of the photoresist layer being greater than a predefined thickness value.

3. The method according to claim 1, wherein, in the changing of the aperture of the diffuser unit, the aperture of the diffuser unit is changed to be larger than a standard aperture value in response to the lithographic process being an exposure process to form a pattern of metal features.

4. The method according to claim 1, wherein the illuminator further includes a light source unit, a beam shaping unit, a light pipe unit and an exposure control unit, and is configured to output a light beam from the light source unit to a reticle through the beam shaping unit, the diffuser unit, the light pipe unit and the exposure control unit, so that the reticle outputs a patterned light beam, the diffuser unit being mounted to an inlet end of the light pipe unit;

wherein the projection apparatus further includes a projection lens assembly, and is configured to receive and project the patterned light beam onto the wafer;

wherein the lithographic process dataset includes the thickness of the photoresist layer and the numerical aperture value of the numerical aperture component to be used in the lithographic process;

wherein the changing of the aperture of the diffuser unit includes detaching the diffuser unit from the inlet end of the light pipe unit, and mounting another diffuser unit to the inlet end of the light pipe unit; and wherein said another diffuser unit has an aperture different from the aperture of the diffuser unit thus detached.

5. The method according to claim 1, wherein the illuminator further includes a light source unit, a beam shaping unit, a light pipe unit and an exposure control unit, and is configured to output a light beam from the light source unit to a reticle through the beam shaping unit, the diffuser unit, the light pipe unit and the exposure control unit, so that the reticle outputs a patterned light beam, the diffuser unit being mounted to an inlet end of the light pipe unit;

wherein the projection apparatus further includes a projection lens assembly, and is configured to receive and project the patterned light beam onto the wafer;

wherein the lithographic process dataset includes the thickness of the photoresist layer and the numerical aperture value of the numerical aperture component to be used in the lithographic process;

wherein the diffuser unit includes a mask component mounted to the inlet end of the light pipe unit and having an aperture, and a diffuser lens disposed between the mask component and the light pipe unit; and wherein the changing of the aperture of the diffuser unit includes changing the aperture of the mask component.

6. The method according to claim 5, wherein the changing of the aperture of the mask component includes detaching the mask component from the inlet end of the light pipe unit, and mounting another mask component to the inlet end of the light pipe unit; and wherein said another mask component has an aperture different from the aperture of the mask component thus detached.

7. The method according to claim 5, wherein the mask component includes a plurality of blades that is movable to change the aperture of the mask component, and the changing of the aperture of the mask component includes moving the blades.

8. The method according to claim 5, wherein the diffuser unit further includes a connecting tube engaged with the inlet end of the light pipe unit and having an aperture that is not smaller than the aperture of the mask component, and the mask component is engaged with the connecting tube;

wherein the changing of the aperture of the mask component includes disengaging the mask component from the connecting tube, and engaging another mask component with the connecting tube; and wherein said another mask component has an aperture different from the aperture of the mask component thus disengaged.

9. The method according to claim 5, wherein the mask component includes a mask container mounted to the inlet end of the light pipe unit and having an aperture, and the diffuser lens is disposed between the mask container and the light pipe unit; and wherein the changing of the aperture of the mask component includes putting a mask plate into the mask container, the mask plate having an aperture smaller than the aperture of the mask container.

10. The method according to claim 5, wherein the mask component includes a mask container mounted to the inlet end of the light pipe unit and having an aperture, and a mask plate placed in the mask container and having an aperture smaller than the aperture of the mask container;

wherein the diffuser lens is disposed between the mask container and the light pipe unit; and wherein the changing of the aperture of the mask component includes replacing the mask plate with another mask plate that has an aperture different from the aperture of the mask plate thus replaced.

11. A method of using a lithographic system to perform lithography, the lithographic system including:

an illuminator including a light source unit, a beam shaping unit, a diffuser unit, a light pipe unit and an exposure control unit, and configured to output a light beam from the light source unit to a reticle through the beam shaping unit, the diffuser unit, the light pipe unit and the exposure control unit, so that the reticle outputs a patterned light beam, the diffuser unit being mounted to an inlet end of the light pipe unit; and a projection apparatus including a projection lens assembly and a numerical aperture component, and configured to receive and project the patterned light beam onto a target wafer, the method comprising:

performing, by the lithographic system, a first lithographic process on a first wafer that serves as the target wafer in the first lithographic process and that is coated with a first photoresist layer having a first photoresist thickness, wherein, in the first lithographic process, the numerical aperture component is set to have a first numerical aperture value that is not greater than a predetermined numerical aperture value, and the diffuser unit has an aperture set to a first diffuser aperture value; and performing, by the lithographic system, a second lithographic process on a second wafer that serves as the target wafer in the second lithographic process and that is coated with a second photoresist layer having a second photoresist thickness greater than the first photoresist thickness, wherein, in the second lithographic process, the numerical aperture component is set to have a second numerical aperture value that is not greater than the predetermined numerical aperture value, and the aperture of the diffuser unit is set to a second diffuser aperture value greater than the first diffuser aperture value.

12. The method according to claim 11, wherein the second lithographic process is performed after the performing of the first lithographic process, and the method further comprises, between the performing of the first lithographic process and the performing of the second lithographic process:

adjusting the aperture of the diffuser unit from the first diffuser aperture value to the second diffuser aperture value.

13. The method according to claim 12, wherein the diffuser unit includes a mask component, and a diffuser lens disposed between the mask component and the light pipe unit; and wherein the mask component includes a plurality of blades that is movable to change an aperture of the mask component, and the adjusting of the aperture of the diffuser unit includes moving the blades to change the aperture of the mask component from the first diffuser aperture value to the second diffuser aperture value.

14. The method according to claim 11, wherein the second lithographic process is performed after the performing of the first lithographic process, and the method further comprises, between the performing of the first lithographic process and the performing of the second lithographic process:

detaching the diffuser unit of which the aperture is of the first diffuser aperture value from the inlet end of the light pipe unit, and mounting another diffuser unit that has an aperture of the second diffuser aperture value to the inlet end of the light pipe unit;

wherein the diffuser unit of which the aperture is of the first diffuser aperture value includes a first diffuser lens having an area equal to an area of the aperture of the diffuser unit; and wherein the another diffuser unit of which the aperture is of the second diffuser aperture value includes a second diffuser lens having an area equal to an area of the aperture of the another diffuser unit.

15. The method according to claim 11, wherein the diffuser unit used in the first lithographic process includes a first mask component mounted to the inlet end of the light pipe unit and having an aperture of the first diffuser aperture value, and a diffuser lens disposed between the first mask component and the light pipe unit; and wherein the second lithographic process is performed after the performing of the first lithographic process, and the method further comprises, between the performing of the first lithographic process and the performing of the second lithographic process:

replacing the first mask component with a second mask component that has an aperture of the second diffuser aperture value.

16. The method according to claim 15, wherein the replacing of the first mask component includes detaching the first mask component from the inlet end of the light pipe unit, and mounting the second mask component to the inlet end of the light pipe unit.

17. The method according to claim 15, wherein the diffuser unit further includes a connecting tube engaged with the inlet end of the light pipe unit and having an aperture that is not smaller than each of the first diffuser aperture value and the second diffuser aperture value; and wherein the first mask component is engaged with the connecting tube in the first lithographic process, and the second mask component is engaged with the connecting tube in the second lithographic process.

18. The method according to claim 11, wherein the diffuser unit includes a mask component, and a diffuser lens disposed between the mask component and the light pipe unit;

wherein the mask component includes a mask container mounted to the inlet end of the light pipe unit and having an aperture not smaller than each of the first diffuser aperture value and the second diffuser aperture value, and the diffuser lens is disposed between the mask container and the light pipe unit;

wherein, in the first lithographic process, the mask component further includes a first mask plate that has an aperture of the first diffuser aperture value and that is placed in the mask container; and wherein the second lithographic process is performed after the performing of the first lithographic process, and the method further comprises, between the performing of the first lithographic process and the performing of the second lithographic process:

removing the first mask plate from the mask container.

19. A lithographic system, comprising:

an illuminator that includes:

a light source unit disposed to emit an initial light beam;

a beam shaping unit disposed to receive and modify the initial light beam, thereby outputting a first modified light beam;

a diffuser unit having an aperture that is adjustable, and disposed to receive and modify the first modified light beam, thereby outputting a second modified light beam;

a light pipe unit disposed to receive and modify the second modified light beam, thereby outputting a third modified light beam, wherein the light pipe unit having an inlet end to which the diffuser unit is mounted; and an exposure control unit disposed to receive and modify the third modified light beam, thereby outputting a fourth modified light beam to a reticle; and a projection apparatus that includes:

a projection lens assembly disposed to receive and modify a patterned light beam that is outputted by the reticle modifying the fourth modified light beam, thereby outputting a fifth modified light beam; and a numerical aperture component having a numerical aperture, and operable to permit passage of the fifth modified light beam to be projected onto a wafer.

20. The lithographic system according to claim 19, wherein the diffuser unit includes a mask component mounted to the inlet end of the light pipe unit, and a diffuser lens disposed between the mask component and the light pipe unit;

wherein the mask component is configured to have an aperture that is adjustable.

* * * * *